(12) United States Patent
Sugimoto et al.

(10) Patent No.: US 7,678,693 B2
(45) Date of Patent: Mar. 16, 2010

(54) EXPOSURE METHOD FOR UPPER LAYER OF HOLE OF SEMICONDUCTOR DEVICE

(75) Inventors: Fumitoshi Sugimoto, Kawasaki (JP); Kiyoshi Ozawa, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 503 days.

(21) Appl. No.: 11/595,917

(22) Filed: Nov. 13, 2006

(65) Prior Publication Data
US 2008/0032437 A1    Feb. 7, 2008

(30) Foreign Application Priority Data
Jun. 14, 2006    (JP)    ............................. 2006-164137

(51) Int. Cl.
*H01L 21/4763*    (2006.01)
(52) U.S. Cl. .................. 438/637; 438/738; 438/945
(58) Field of Classification Search ................. 438/637, 438/638, 639, 640, 737, 738, 942, 945, 948, 438/949
See application file for complete search history.

(56) References Cited

U.S. PATENT DOCUMENTS

| | | | |
|---|---|---|---|
| 6,569,580 B2 * | 5/2003 | Campi et al. .................... 430/5 |
| 6,686,300 B2 * | 2/2004 | Mehrotra et al. ............. 438/142 |
| 7,015,133 B2 * | 3/2006 | Su et al. ...................... 438/618 |
| 2005/0153245 A1 * | 7/2005 | Sato et al. .................... 430/313 |

FOREIGN PATENT DOCUMENTS

JP    2005-64226 A    3/2005

* cited by examiner

*Primary Examiner*—Kevin M Picardat
(74) *Attorney, Agent, or Firm*—Westerman, Hattori, Daniels & Adrian, LLP

(57) ABSTRACT

An exposure method executed after processing a hole in a substrate of a semiconductor device, has an exposure step of transferring a pattern on a mask onto an upper layer of the hole and forming a wiring groove by exposure, wherein a quantity of exposure with which a wiring groove 11 just above the hole or the wiring groove in the vicinity of the hole is exposed to light, is greater than a quantity of exposure with which a wiring groove 11A in a position spaced away from just above the hole is exposed to the light.

26 Claims, 30 Drawing Sheets

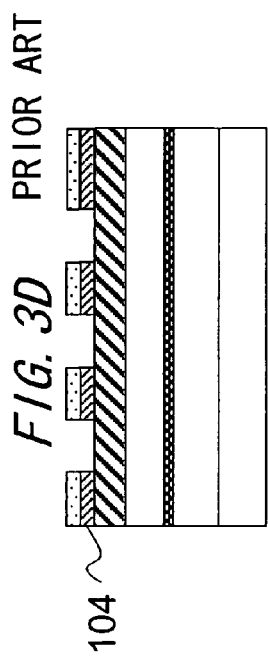
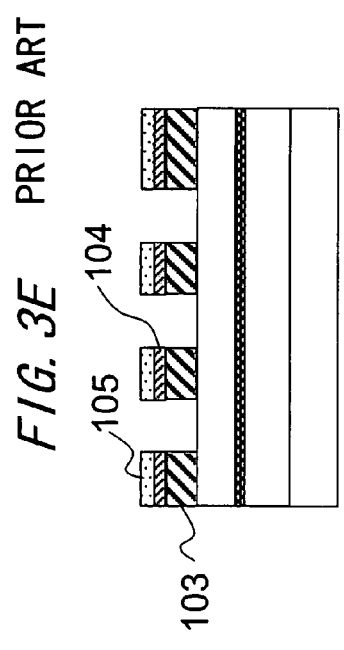
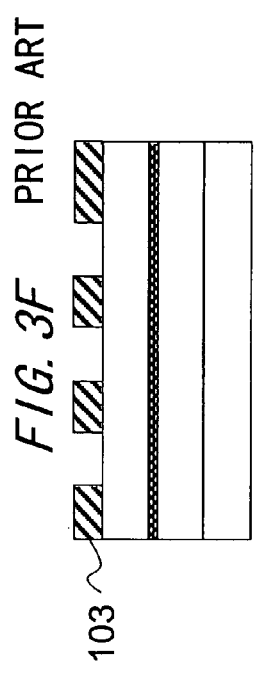

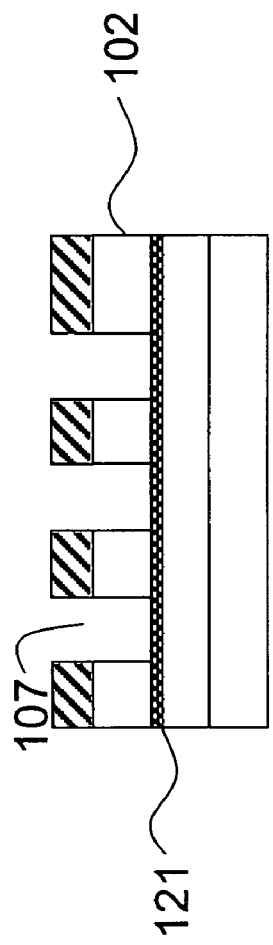
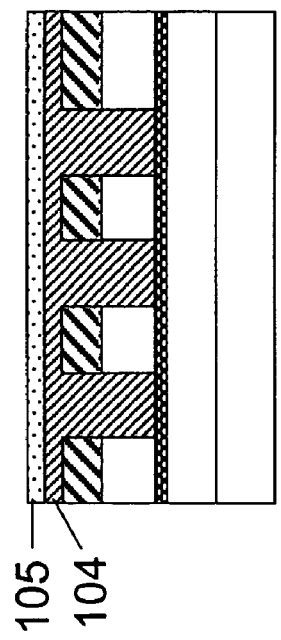

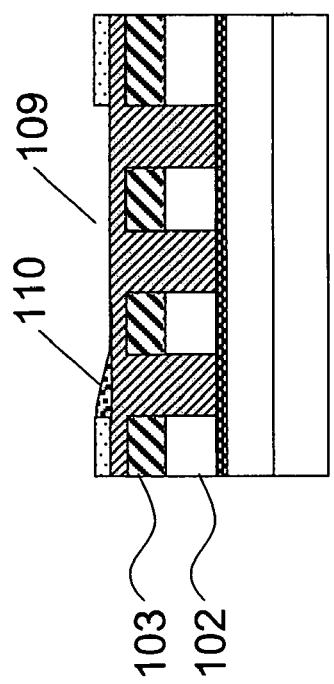
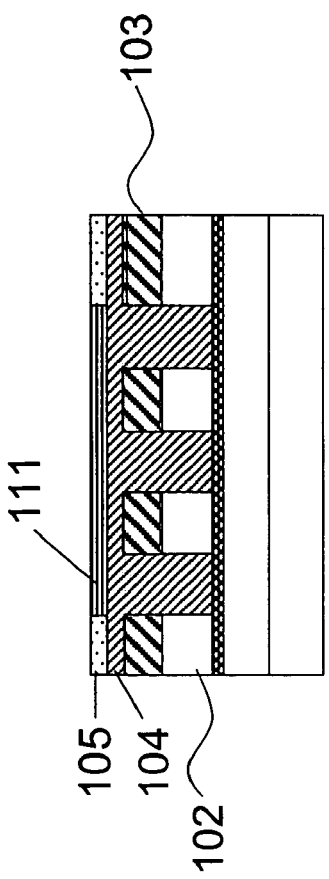

EXPOSURE METHOD FOR UPPER LAYER OF HOLE OF SEMICONDUCTOR DEVICE

BACKGROUND OF THE INVENTION

The present invention relates generally to a semiconductor device, and more particularly to a semiconductor device manufactured by photolithography processing, a mask for exposure that is used in a photolithography step and a pattern correcting method.

Over the recent years, a device pattern having an extremely small size has been required to be formed on a semiconductor substrate in order to meet demands for speed-up and a higher density of the semiconductor device.

Submicronization of the semiconductor device is actualized by shortening a wavelength of a light source of an exposure apparatus employed for optical lithography. At the present, a design rule of the semiconductor device reaches a level that is equal to or less than 100 nm. This value is smaller than the wavelength of the light source of the exposure apparatus needed for transferring a mask pattern in an optical lithography step. For instance, a wavelength of an argon fluoride (ArF) excimer laser employed as the light source is on the order of 193 nm.

In this case, on the occasion of transferring the pattern on the mask onto the substrate by the optical lithography, the size of the pattern to be transferred exceeds a resolution limit. Therefore, an influence of an optical proximity effect due to diffraction etc augments, then a shape of the pattern formed on the substrate changes, and there occurs a difference between the size of the pattern that should be transferred from the mask pattern and the size of the pattern actually transferred onto the substrate. Such being the case, an optical proximity correction (OPC) method is proposed as a means for correcting this difference.

The OPC is a pattern transferring technology of correcting changes of the shape and the size of the pattern transferred onto the substrate by a method such as partially changing (making thicker or thinner) the mask pattern beforehand conversely to a (an actual) change of the pattern (the pattern gets thinner or thicker), which occurs when transferring the mask pattern onto the substrate, or a method of disposing a dummy pattern and so forth.

An example of the OPC will be explained with reference to FIGS. 1A, 1B, 2A and 2 B. FIGS. 1A and 2A respectively illustrate mask patterns on reticles (R1, R2). Further, FIGS. 1B and 2B respectively depict patterns formed by transferring the mask patterns on the reticles R1, R2 onto semiconductor substrates (W1, W2). Note that the semiconductor substrate is also referred to as a wafer.

For example, FIG. 1A shows a mask pattern 1 in which patterns are arrayed, and FIG. 1B illustrates a pattern 2 transferred onto the substrate by use of the mask pattern 1. In this example, the mask pattern is a pattern in which a multiplicity of rectangles is arrayed.

The mask pattern 1 in FIG. 1A includes a hatching area defined as a light shielding area and outlined regions defined as light transmitting regions. A transfer pattern 2 is formed onto the resist on the substrate by the light traveling through the light transmitting regions. In the array of the rectangles configuring the mask pattern 1, the optical proximity effect differs with respect to patterns 3 arranged inwardly of the array (in positions toward the center from an outer peripheral area of the array) and with respect to patterns 4 arranged along the outer peripheral area of the array, and hence such a problem arises that the transfer patterns have difference in their sizes. The OPC is applied in order to correct this difference.

For instance, the patterns arranged in the vicinity of the peripheral area of the array of rectangles are set, as seen about patterns 7 in FIG. 2A, larger than the patterns 4 in FIG. 1A in order to eliminate the difference in size. As a result, there is no size difference of the transfer pattern transferred onto the substrate (8 in FIG. 2B). Thus, according to the OPC, a light quantity of the light transmitting region is adjusted by changing the mask pattern size, thereby controlling the size of the transfer pattern on the substrate.

On the other hand, a low dielectric constant material, which is a so-called a low-K film, is used for an inter-layer insulating film of wiring in order to attain speed-up of the high-density semiconductor substrate. This aims at reducing a wiring capacity by employing the low dielectric constant material and, as a result, attaining the speed-up of the wiring.

A material such as SiOC has hitherto been known as the low dielectric constant material. Further, recently a porous insulating film called porous silica (porous silica (silicon oxide)) is used for decreasing the dielectric constant. This type of insulating film has a small etching selection ratio with respect to the resist used for forming the transfer pattern, and therefore a film such as a silicon nitride film is employed as an etching mask, wherein etching is thus conducted.

This type of nitrogen-contained insulating film might be used for avoiding such a problem that the dielectric constant increases when the low-K film is exposed to an ashing gas in a resist removal step (ashing step). For others, the nitrogen-contained insulating film is used as an intermediate etching stopper layer for forming a dual Damascene structure or as a cap layer in a CMP (Chemical Mechanical Planarization) step. It should be noted that the dual Damascene structure connotes a Damascene structure including both of grooves and holes. Further, the Damascene structure represents a structure in which the wiring is embedded in the groove.

On the occasion of using Cu etc as a wiring material, the dual Damascene structure is employed. In the dual Damascene structure, a wiring pattern and hole patterns connecting the wiring pattern upwardly and downwardly, are simultaneously formed. A feature of the dual Damascene structure is that after simultaneously forming a hole pattern layer and a wiring pattern layer in which Cu is embedded, Cu is further embedded by a plating method and is thereafter planarized by CMP method. It is to be noted that patent document 1 given below is known in relation to the technology described above.

[Patent document 1] Japanese Patent Application Laid-Open Publication No. 2005-64226

SUMMARY OF THE INVENTION

In the dual Damascene structure, after the hole layer has been formed in a photolithography step and in an etching step, the pattern wiring layer is formed in the photolithography step and in the etching step. Then, Cu etc is embedded simultaneously in the hole layer and in the wiring layer. On this occasion, however, even when transferring a pattern having a desired size by use of a mask corrected by the OPC, a problem arises, wherein the size of the resist fluctuates or a solution defect occurs in the wiring pattern connected to the outer peripheral area of the densely arrayed hole pattern and in the wiring pattern connected to an isolated hole.

The present invention was devised in order to solve these conventional problems. Namely, it is an object of the present invention to reduce the fluctuation of the pattern size and the solution defect of the resist pattern in forming the pattern after forming the hole layer.

The present invention adopts the following means in order to solve the problems given above. Namely, the present invention is an exposure method executed after processing a hole in a substrate of a semiconductor device, comprising an exposure step of transferring a pattern on a mask onto an upper layer of the hole and forming a wiring groove by exposure, wherein a quantity of exposure with which the wiring groove just above the hole or the wiring groove in the vicinity of the hole is exposed to light, is greater than a quantity of exposure with which the wiring groove in a position spaced away from just above the hole is exposed to the light.

According to the present invention, in the pattern formation in the case of the hole existing in the lower layer, the quantity of exposure is controlled corresponding to a hole density thereof, thereby making it possible to restrain the pattern fluctuation and the solution defect of the resist pattern, which are derived from the hole density.

According to the present invention, it is feasible to restrain the pattern fluctuation and the solution defect of the resist pattern in the pattern formation after forming the hole layer.

BRIEF DESCRIPTION OF THE DRAWINGS

FIG. 3D is a view (part 1) showing the method of manufacturing the conventional dual Damascene structure;

FIG. 3E is a view (part 1) showing the method of manufacturing the conventional dual Damascene structure;

FIG. 3F is a view (part 1) showing the method of manufacturing the conventional dual Damascene structure;

FIG. 3G is a view (part 1) showing the method of manufacturing the conventional dual Damascene structure;

FIG. 3H is a view (part 1) showing the method of manufacturing the conventional dual Damascene structure;

FIG. 3I is a view (part 1) showing the method of manufacturing the conventional dual Damascene structure;

FIG. 3J is a view (part 1) showing the method of manufacturing the conventional dual Damascene structure;

DETAILED DESCRIPTION OF THE INVENTION

A mask for exposure and a semiconductor device manufacturing method using this mask according to a best mode (which will hereinafter be termed an embodiment) for carrying out the present invention, will hereinafter be described with reference to the drawings. A configuration in the following embodiment is an exemplification, and the present invention is not limited to the configuration in the embodiment.

<Substance of the Invention>

A series of processes of forming a wiring structure based on a Damascene structure by a conventional method will hereinafter be explained with reference to FIGS. 3A-3J.

(1) An inter-layer film 102 composed of a porous silica film is formed up to 500 nm on a semiconductor substrate 101 so that an etching stopper 121 is interposed in between the substrate 101 and the inter-layer film 102. Note that the inter-layer film 102 may also be made from inorganic siloxane or organic siloxane.

Figure 3A:
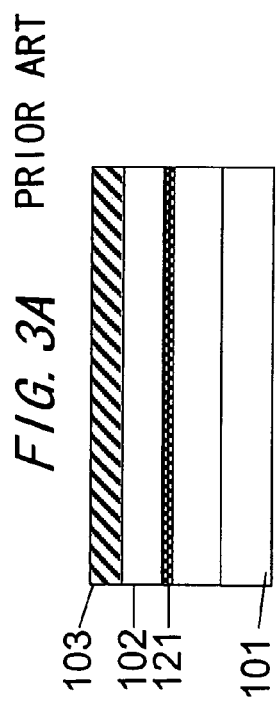
FIG. 3A is a view (part 1) showing a method of manufacturing a conventional dual Damascene structure.

Next, a thin film 21 (which is generally referred to as a hard mask and is, herein, called a mask thin film) becoming a mask when etching, is formed up to 150 nm by use of a silicon nitride film on the inter-layer film 102 (FIG. 3A). It is to be noted that a mask thin film 103 defined as a hard mask layer may be formed of at least a SiO, SiC, SiOC, SiOCN or SiN film.

Figure 3B:
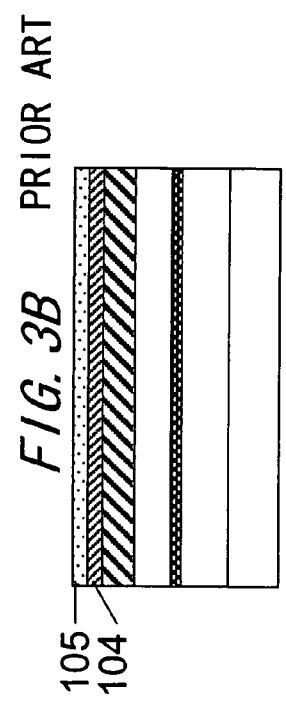
FIG. 3B is a view (part 2) showing the method of manufacturing the conventional dual Damascene structure.

(2) An organic anti-reflection film composed of novolac resin etc is coated up to 80 nm, and an organic chemical amplification type positive resist 105 is coated up to 250 nm (FIG. 3B).

Figure 1A:
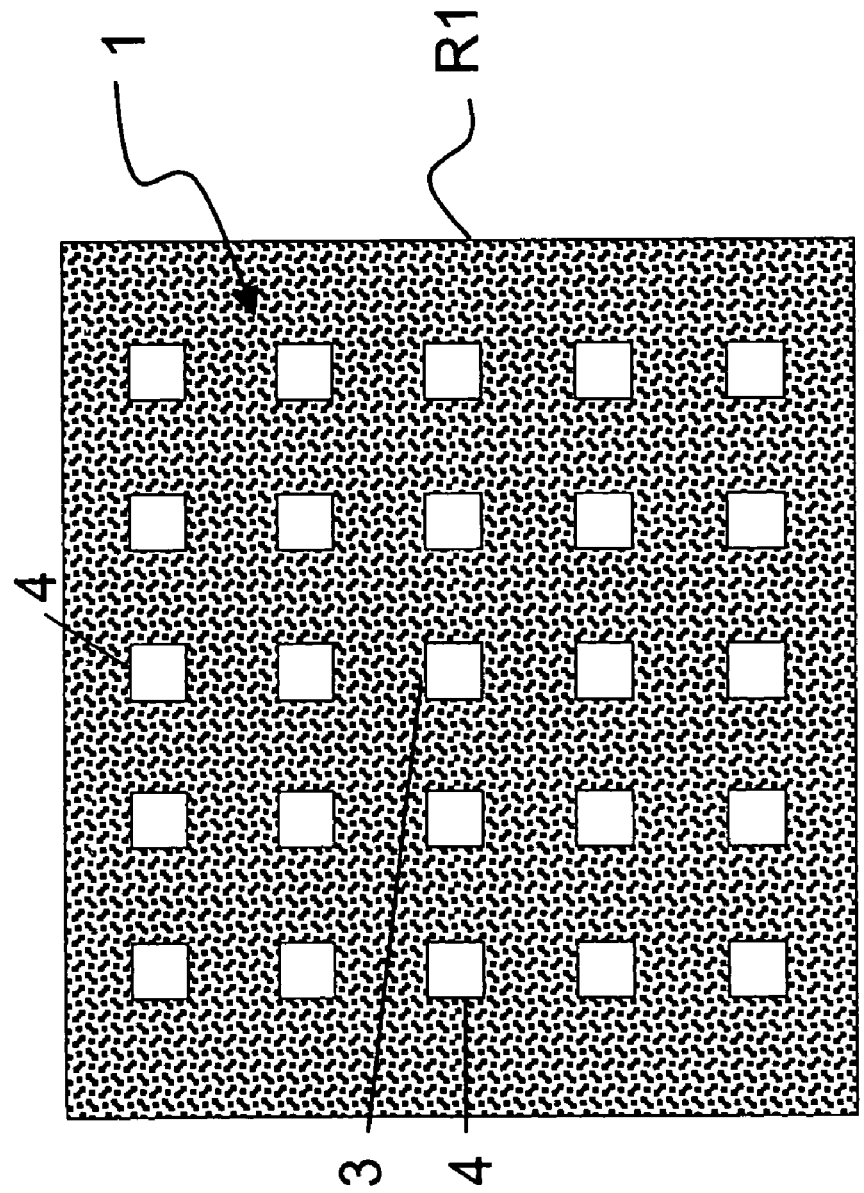
FIG. 1A is a view serving as an original view that shows a mask pattern.
Figure 1B:
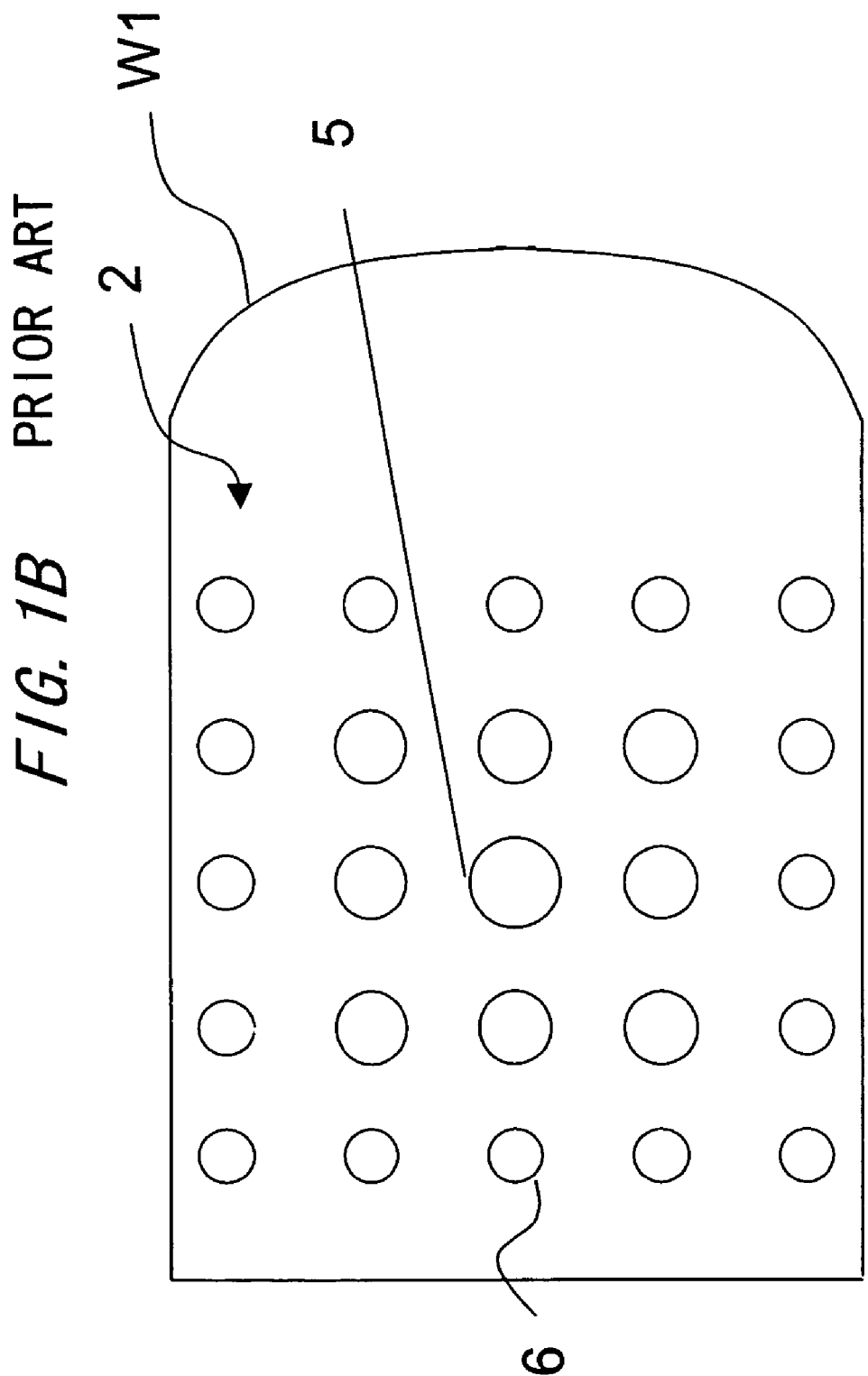
FIG. 1B is a view showing a pattern when transferring the mask pattern in FIG. 1A.
Figure 2A:
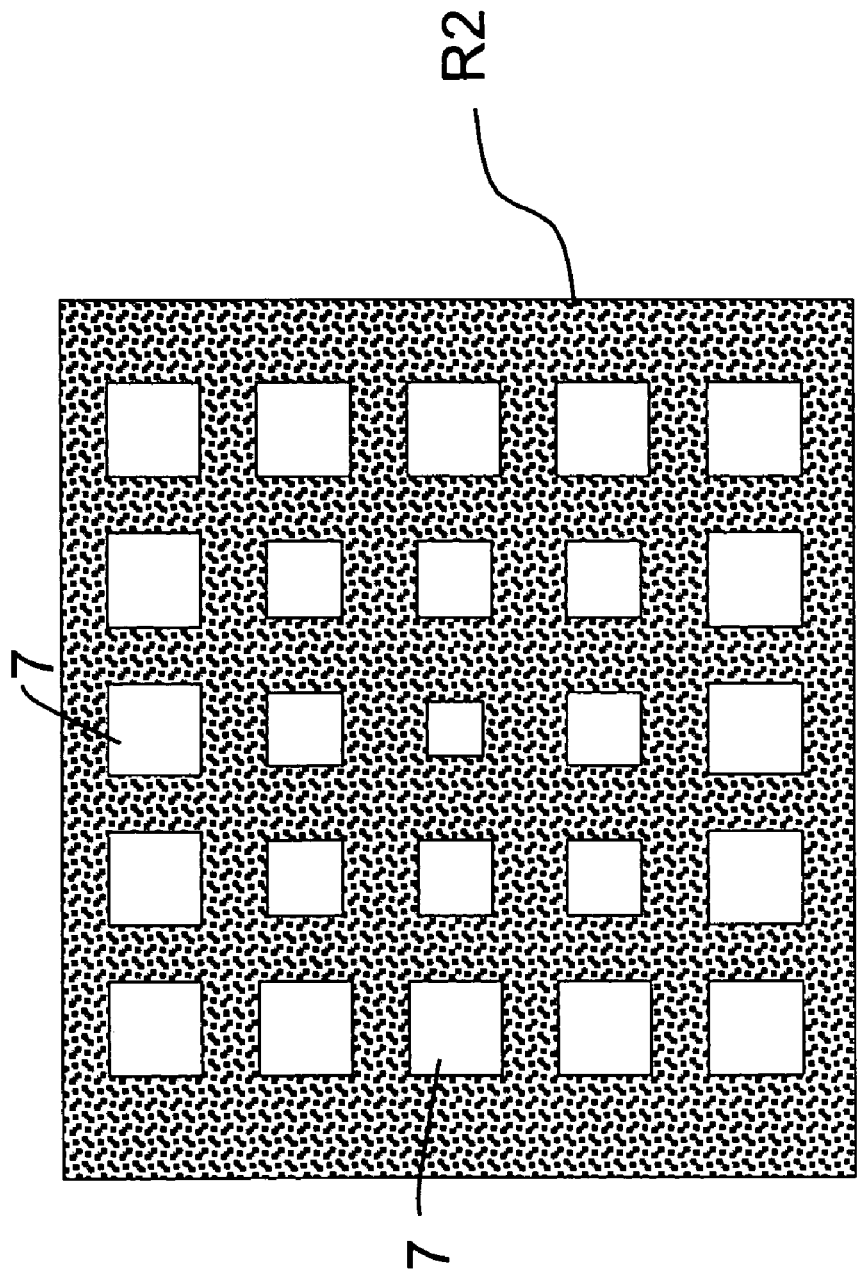
FIG. 2A is a view depicting a mask pattern corrected by a conventional method.
Figure 2B:
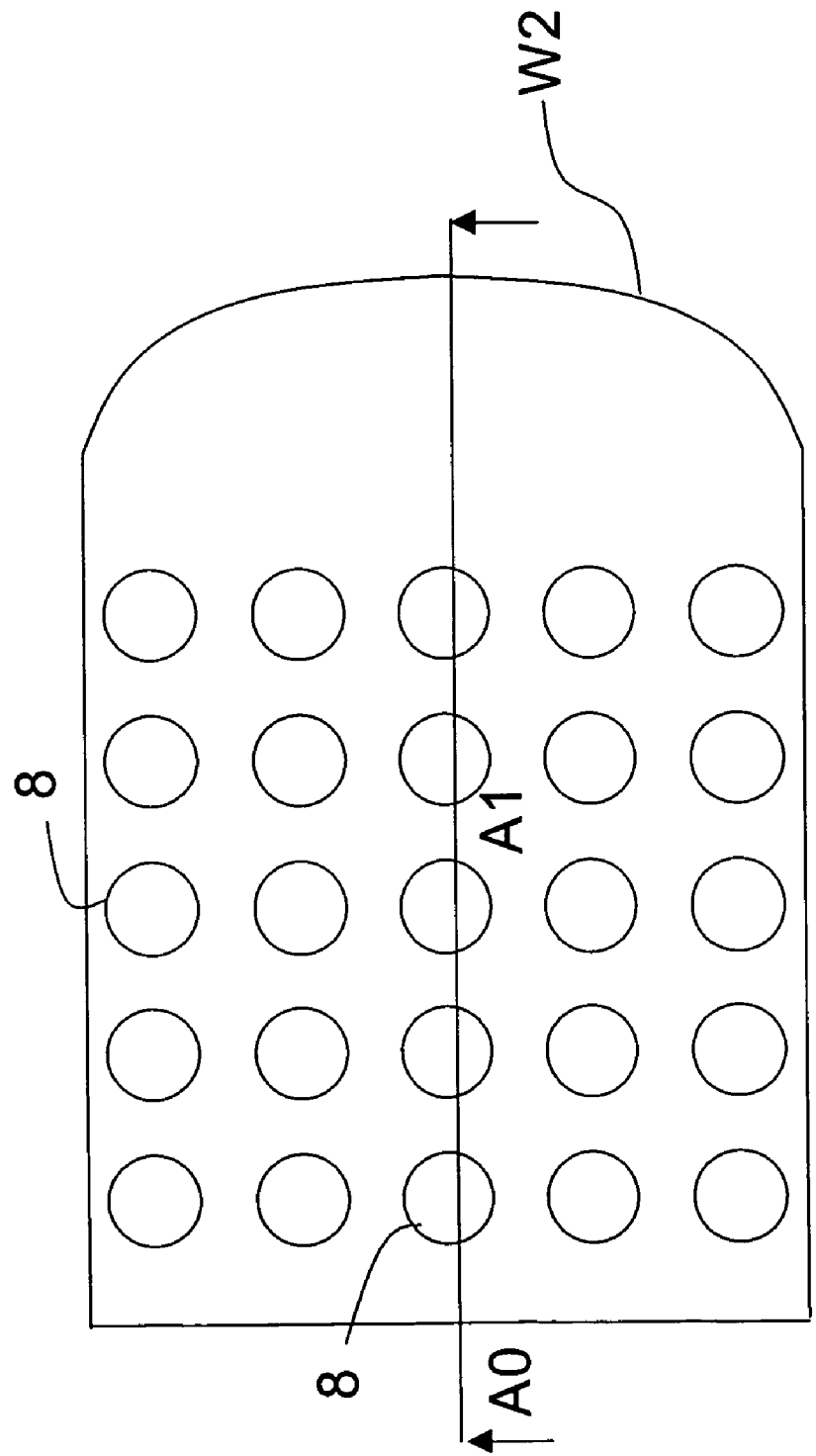
FIG. 2B is a view illustrating a pattern when transferring the mask pattern in FIG. 2A.
Figure 3C:
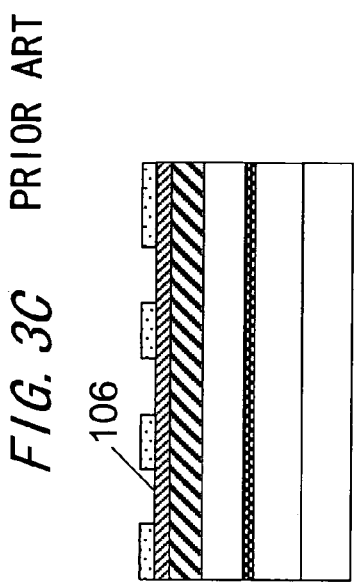
FIG. 3C is a view (part 1) showing the method of manufacturing the conventional dual Damascene structure.

(3) Hole patterns are exposed to light and thus developed, thereby forming a resist pattern 106 (FIG. 3C) FIG. 3C illustrates a section as viewed in a direction corresponding to a direction of an arrowhead line in FIG. 2B in a way of being cut off in a direction vertical to the substrate in a position of projecting a line segment A0-A1 extending over the hole patterns 8 in FIG. 2B onto the semiconductor substrate.

(4) With the resist pattern 106 used as a mask, the anti-reflective coating 104 is etched by employing an etching gas (unillustrated) of fluorocarbon (FIG. 3D).

(5) Further, the mask thin film 103 is etched by use of an etching gas (not shown) of the fluorocarbon to which oxygen is added (FIG. 3E).

(6) The positive resist 105 and the anti-reflective coating 104 are removed by ashing that uses nitrogen or argon (FIG. 3F).

(7) The inter-layer film 102 is etched by use of an etching gas (unillustrated) of the fluorocarbon to which the oxygen and carbon monoxide are added, wherein the pattern thus formed on the mask thin film 103 is employed as a mask (FIG. 3G). The inter-layer film 102 is etched down to the etching stopper 121, thereby forming a hole layer 107.

(8) The organic anti-reflective coating 104 composed of the novolac resin etc is coated up to 80 nm, and the organic chemical amplification type positive resist 105 is coated up to 250 nm (FIG. 3H).

(9) The wiring pattern (not shown) is exposed to the light and developed, thereby forming a resist pattern 109. On this occasion, however, in the resist 105 that should be originally dissolved, an area of the resist pattern 109 remains, and an opening defect 110 might occur (see FIG. 3I). This opening defect 110 is called resist poisoning, and, if this resist poisoning occurs, a desire wiring pattern can not be formed by etching. The occurrence of the resist poisoning leads to problems of causing a decrease in yield of the semiconductor device and a decline of reliability thereof.

A means for preventing the resist poisoning involves an operation of coating an embedding layer over a lower area of a Bottom Anti-Reflective Coating (which is abbreviated to BARC), however, this method has an increased number of steps and therefore causes such problems that the process gets complicated and a cost rises. Alternatively, a known method is a method of forming a dummy pattern in the vicinity of an isolated pattern (via) on the semiconductor substrate. This method, however, requires actually generating the dummy pattern on each single semiconductor substrate and is unable to prevent the resist poisoning occurred in a densely arrayed pattern.

On the occasion of solving the problems, a mechanism of how the resist poisoning occurs will be explained with reference to FIG. 3J. When exposing the wiring pattern (unillustrated) to the light, a latent image 111 is formed in an area, upon which the light impinges, of the positive resist 105. The resist 105 is of the chemical amplification type, and hence protons ($H^+$) are generated in the latent image 111 by an acid producing agent. Subsequently, when heating the resist 105, the protons ($H^+$) dissolve a solution restrainer contained in the resist. With this dissolution, the resist 105 becomes soluble to an alkaline developer, and a pattern is formed.

If the inter-layer insulating film 102 involves using the porous silica etc, it might happen that a gas or a reactive product produced when etching the hole layer (107) in the porous area thereof is taken in as a basic substance (which is, though not shown, e.g., an amine-series substance). The reactive product exudes and reacts to the protons ($H^+$), whereby the protons ($H^+$) disappear. Therefore, a quantity of existence of the protons ($H^+$) in the latent image 111 decreases, and the dissolution of the resist becomes insufficient. As a result, the opening defect 110 illustrated in FIG. 3I occurs.

Further, when etching the nitride film used as the mask thin film 103 for etching, a large quantity of basic reactive products are produced and remain within the nitride film and in a layer vicinal to the nitride film due to the existence of the nitrogen (N) in the nitride film. Hence, the basic reactive product reacts to the protons ($H^+$), thereby causing the opening defect 110. Moreover, if the etching stopper 121 contains the nitrogen (N), the opening defect 110 is also caused.

The basis substances are easy to concentrate in an outer peripheral area to the densely arrayed pattern and in the isolated pattern, and therefore the opening defect easily occurs especially in the outer peripheral area to the densely arrayed pattern and in the isolated pattern. In FIGS. 3H-3I, the anti-reflective film 104 is formed under the resist 105. The anti-reflective film 104 is, however, the same organic film as the resist 105 and therefore easily transmits the basic substance produced.

The present embodiment will give a description of an exposure step of restraining the occurrence of the opening defect by preventing the resist poisoning, even when the basic substance is generated, in a way that increases a quantity of generation of the protons ($H^+$) in the pattern area where the opening defect is easy to occur.

The quantity of generation of the protons ($H^+$) depends on a quantity of light and on overheating after the exposure. This being the case, correction other than the OPC (Optical Proximity Correction) is applied to the mask pattern used in the photolithography step in order to increase the quantity of light in the pattern area where the opening defect is easy to occur. Alternatively, the heating may be locally conducted after the exposure. It is to be noted that if a specified area is locally heated after the exposure, with respect to the generation of the protons ($H^+$), there is, in an effective sense, the same effect as in the case of increasing the quantity of exposure in this specified area.

<Working Example in the Case of Densely Arraying Holes>

Steps of manufacturing a dual Damascene structure are illustrated as below according to the present invention. Employed as an exposure apparatus is a reduction projection type exposure apparatus, wherein a light source is an ArF excimer laser (wavelength; 193 nm) having a lens of which an aperture ratio is 0.80, and a reduction rate is 1/4 (a mask pattern size:a pattern size on a transferred image forming surface=4:1). Exemplified herein is a result of forming a pattern of which a pattern size is on the order of 100 nm. The dimension (size) presented in the present embodiment is the pattern size on the image forming surface. Further, the wavelength is not limited to 193 nm. For instance, the steps in the present embodiment can be applied to the exposure using ultraviolet rays of which a wavelength is shorter than 250 nm.

Figure 4:
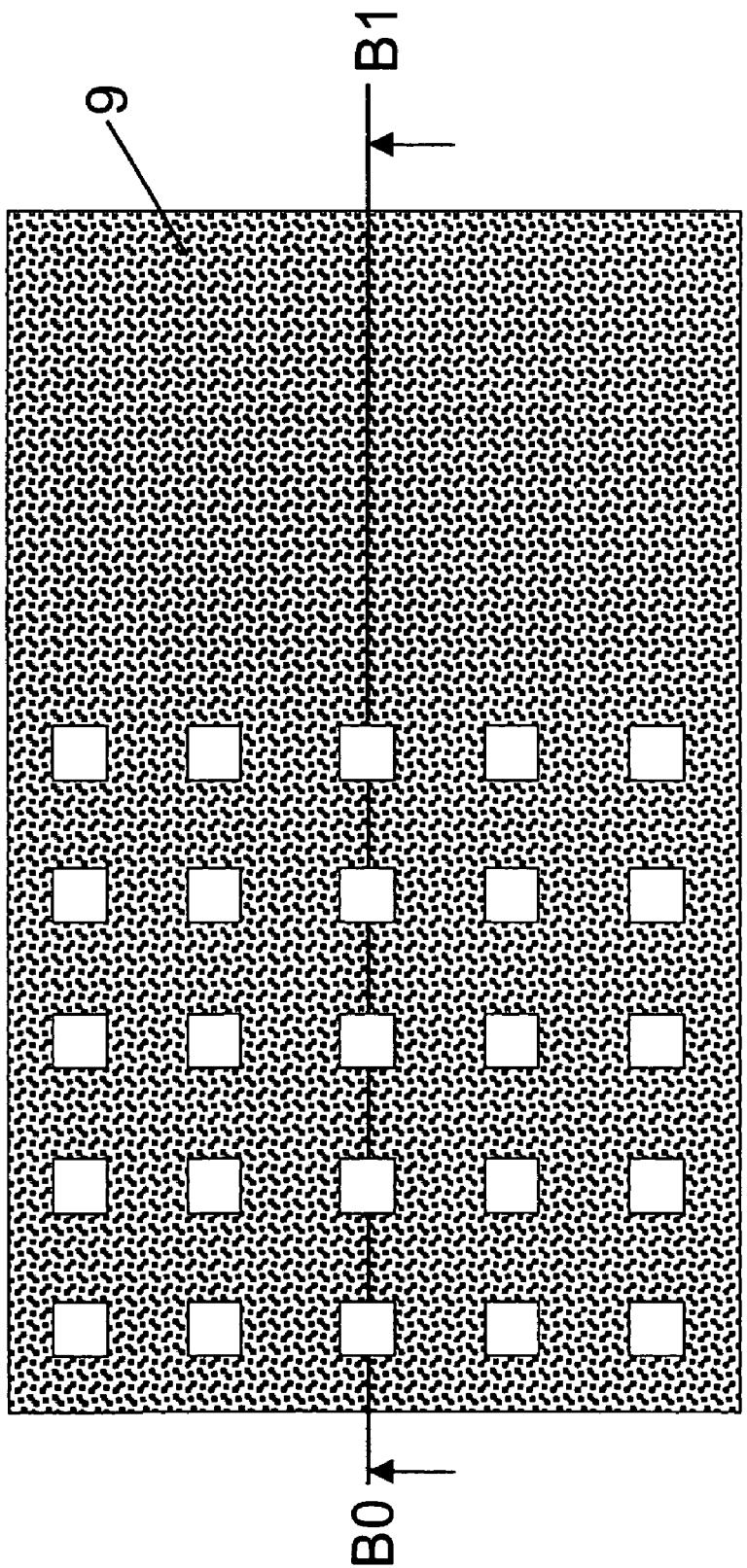
FIG. 4 is a view depicting the mask pattern of the hole used in a working example.
Figure 5:
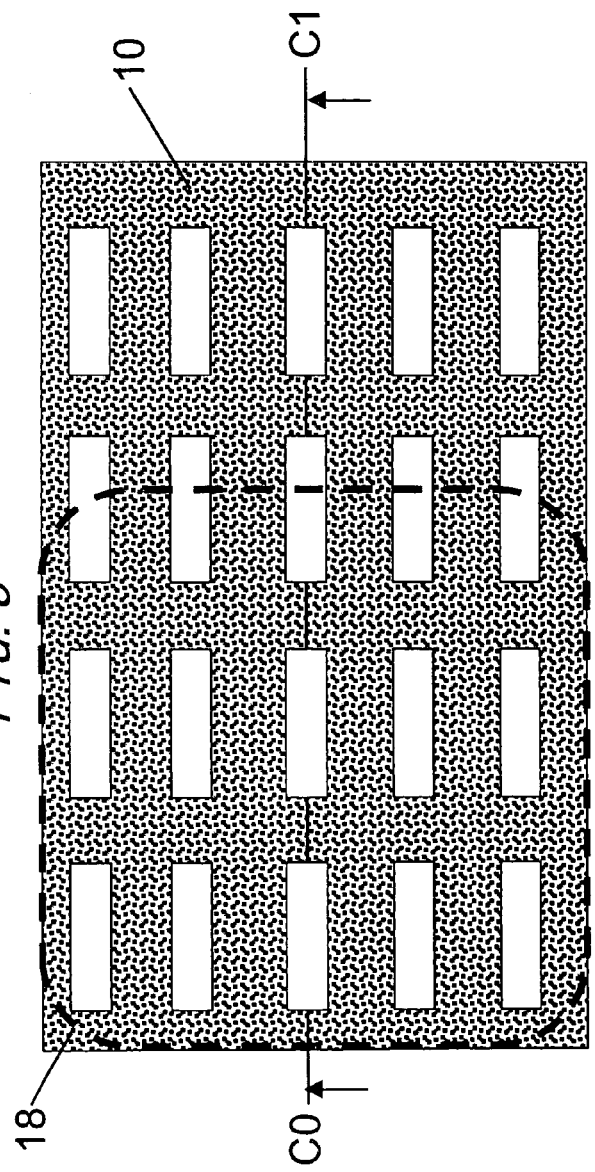
FIG. 5 is a view illustrating the conventional mask pattern of wiring that is used in the working example.
Figure 6:
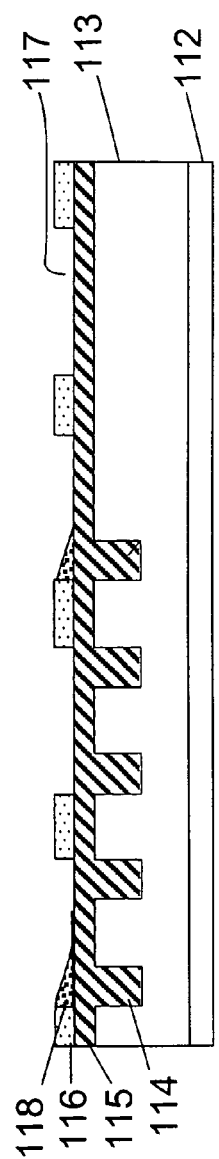
FIG. 6 is a view showing a dual Damascene structure obtained by use of the mask patterns in FIGS. 4 and 5.

FIG. 4 shows a configuration of a hole mask 9. FIG. 5 shows a configuration of a wiring mask. FIG. 6 shows an example of the dual Damascene structure. Given herein is a working example of manufacturing the dual Damascene structure by use of the hole mask 9 in FIG. 4 and the wiring mask 10 in FIG. 5.

Note that FIGS. 4 and 5 illustrate, for facilitating the understanding, the masks with omission of a prospective change of the mask pattern size by the OPC described above. FIG. 6 is a sectional view as viewed in a direction corresponding to a direction of an arrowhead line in a way of being cut off in a direction vertical to the substrate in a position of projecting a line segment B0-B1 in FIG. 4 and a line segment C0-C1 in FIG. 5 onto the semiconductor substrate. The line segment B0-B1 and the line segment C0-C1 are in an overlapped relationship with each other.

FIG. 6 shows a semiconductor substrate 112, an inter-layer film 113, a hole layer 114 formed by transferring and etching in a way that uses the hole mask 9, an anti-reflective coating 115, a resist 116, a wiring pattern 117 formed by transferring the wiring mask 10, and an opening defect 118 caused by the resist poisoning. Note that etching mask and the etching stopper are omitted in their illustrations.

Figure 7:
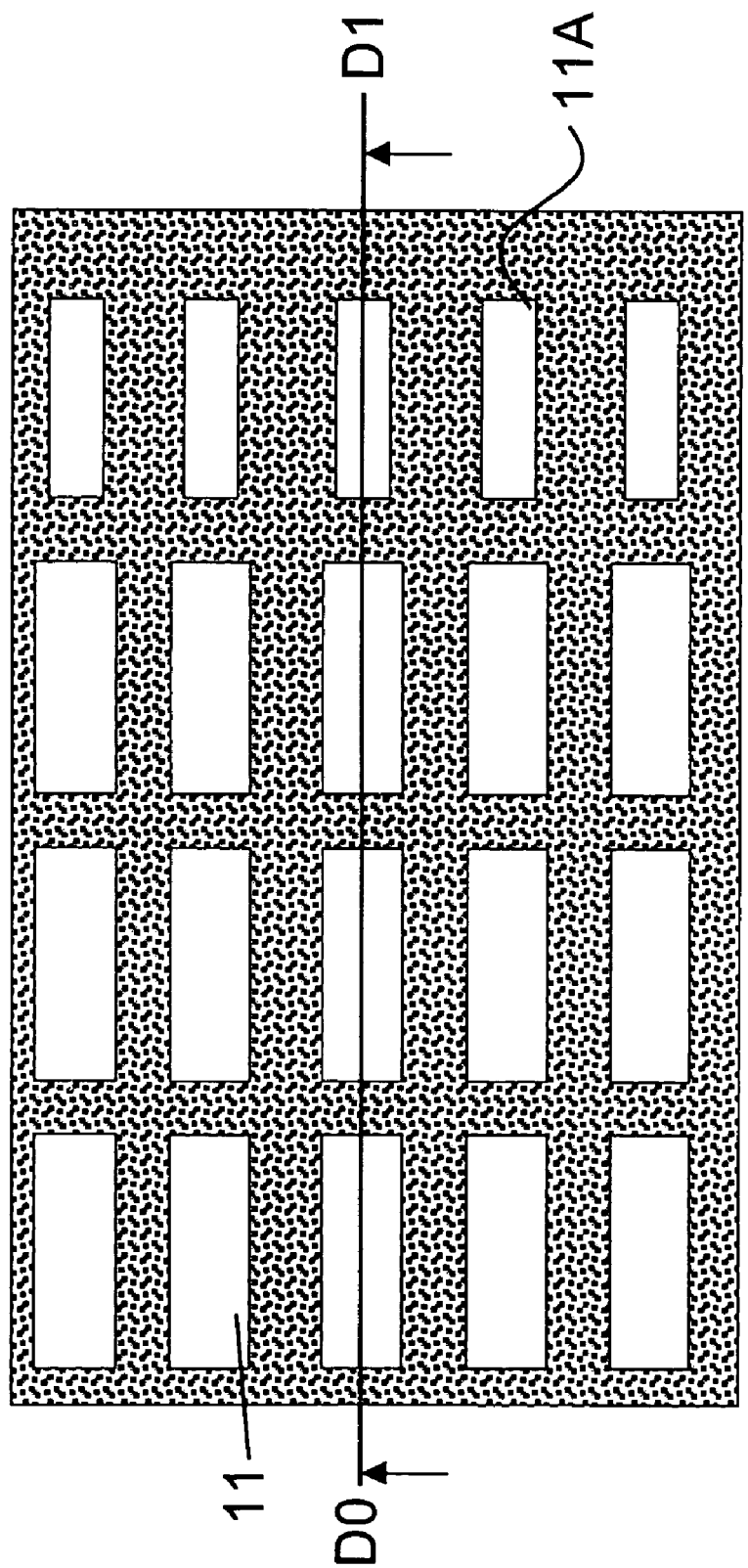
FIG. 7 is a view illustrating a method of correcting the mask pattern of the wiring according to the present invention.

As already shown in the example of the prior art, in the case of forming the dual Damascene structure by employing the conventional hole mask 9 and the conventional wiring mask 10, the opening defect 118 occurs in a region, where the hole layer 114 exists thereunder, within the area of the wiring pattern 117 in FIG. 7. Such being the case, a mask obtained by improving the wiring mask 10 shown in FIG. 5 in the following manner according to the present invention is employed as the wiring mask, and the occurrence of the opening defect 118 is thereby prevented.

FIG. 7 shows an example of the improved mask used in the present working example. A contrivance of the improved mask in FIG. 7 is that the quantity of exposure is corrected by relatively increasing the wiring pattern size in a region where the hole exists (see the wiring pattern designated by the reference numeral 11). Note that the reference symbol 11A represents the wiring pattern in a region where the hole does not exist. Thus, in the mask in FIG. 7, the quantity of exposure with which the wiring pattern 11 just above the hole or the wiring pattern in the vicinity of the hole is exposed to the light, is larger than the quantity of exposure with which the wiring pattern 11A in the position spaced away from just above the hole is exposed to the light.

This type of correction may be applied to a pattern before changing the size (dimension) by the OPC. Further, the correction in FIG. 7 may also be applied to a pattern after changing the size (dimension) by the OPC. A size change rate is, it is desirable, 1% through 3% of a desired transferring pattern size.

Figure 8:
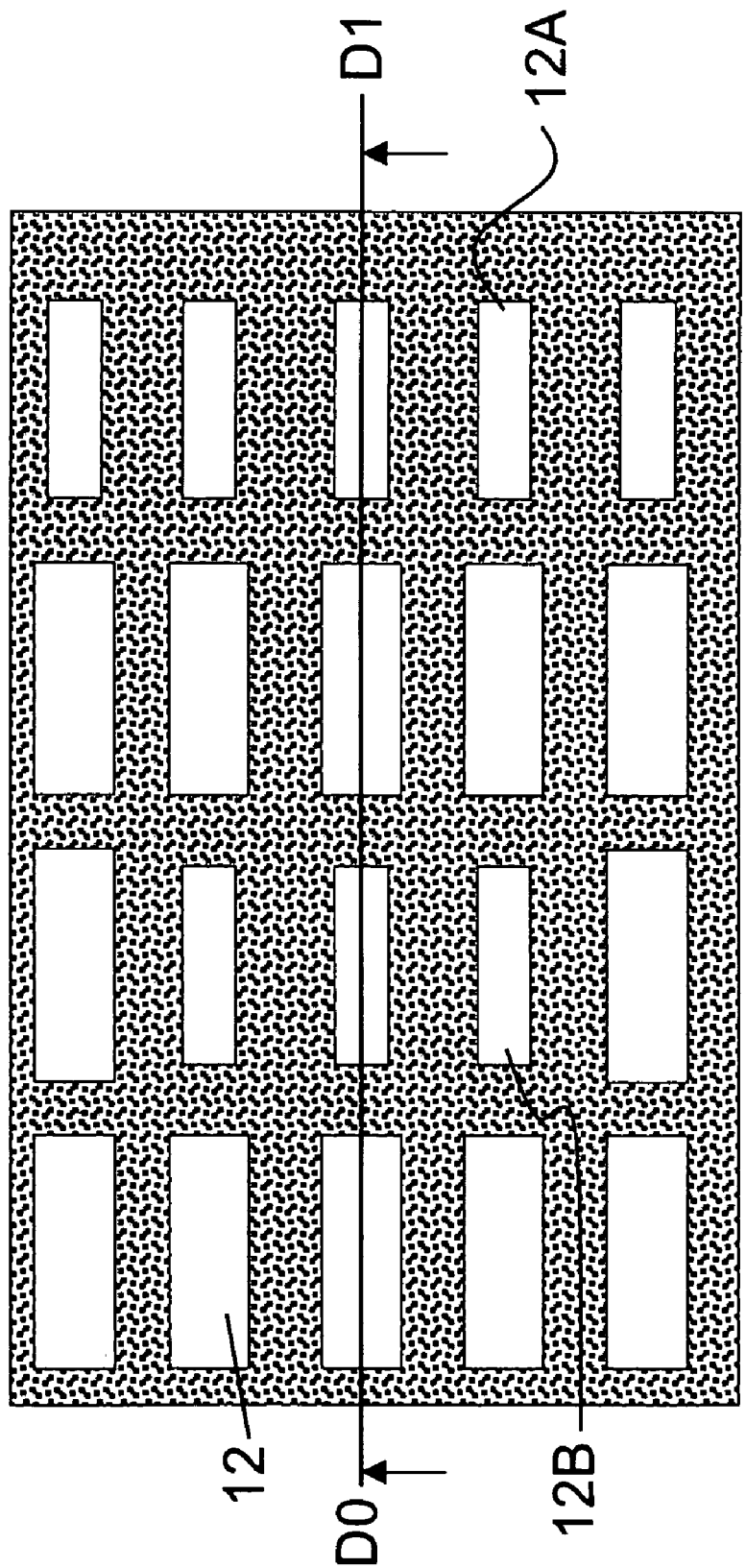
FIG. 8 is a view illustrating the method of correcting the mask pattern of the wiring according to the present invention.

As illustrated in FIG. 8, in a case where the holes are densely arrayed, only the size of each of the wiring patterns disposed in an outside area of the hole array may be changed (the quantity of exposure is increased) (see the wiring pattern denoted by the reference numeral 12). It is noted that the reference symbol 12A represents the wiring pattern in the region where none of the holes exists. Further, each of the wiring patterns disposed in an inside area of the hole array is designated by the reference symbol 12B. Thus, the wiring patterns 12 disposed in the outside area of the hole array are formed thicker than the wiring patterns 12A and 12B.

Figure 9:
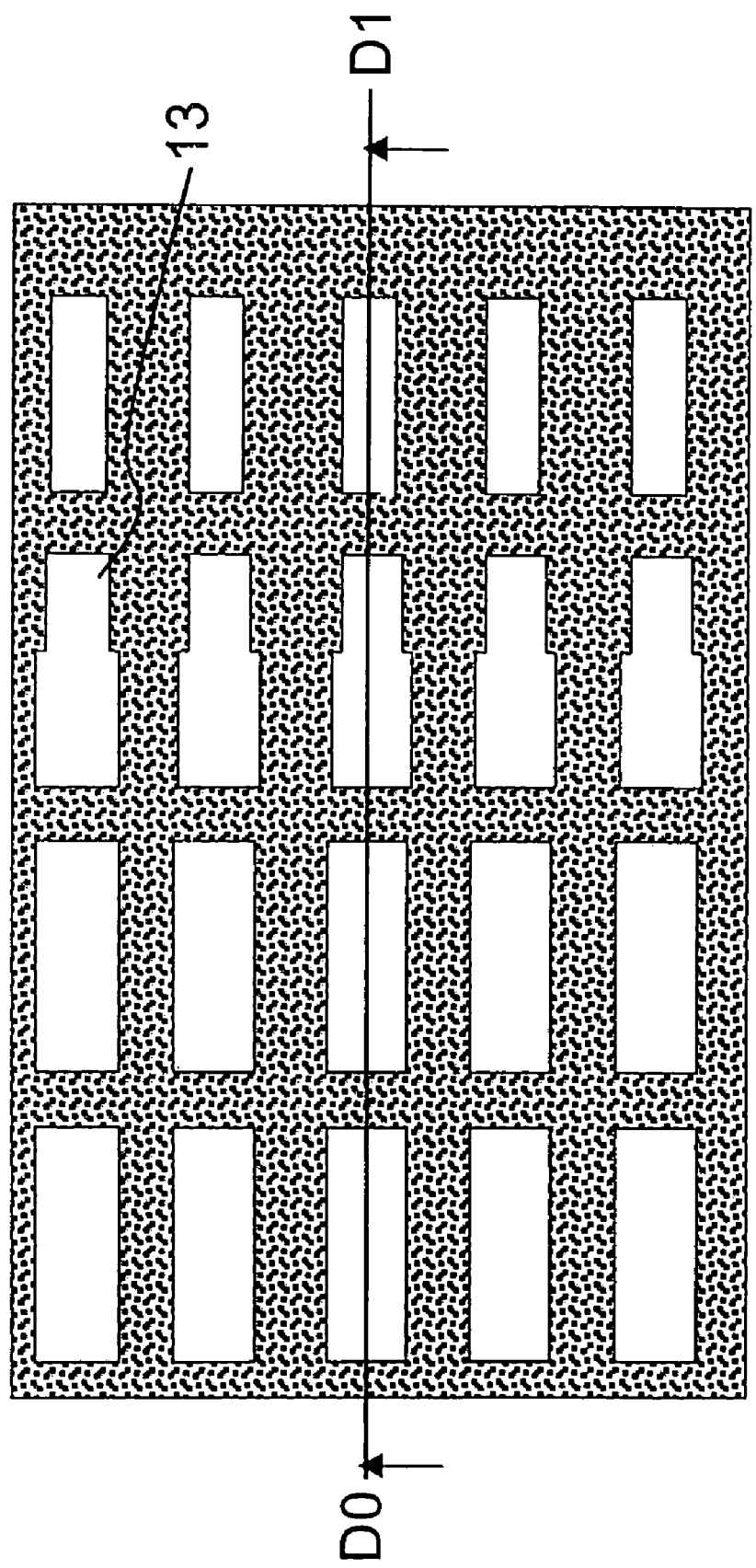
FIG. 9 is a view illustrating the method of correcting the mask pattern of the wiring according to the present invention.

As shown in FIG. 9, in a case where the hole exists in only a one-sided lower layer of the wiring, a size changing region may be limited (see the wiring pattern designated by the reference numeral 13). To be specific, in the wiring pattern 13, the hole existing region (which is a left-sided region of the wiring 13) is formed relatively thick, while the hole non-existing region (which is a right-sided region of the wiring 13) is formed relatively thin.

Figure 10:
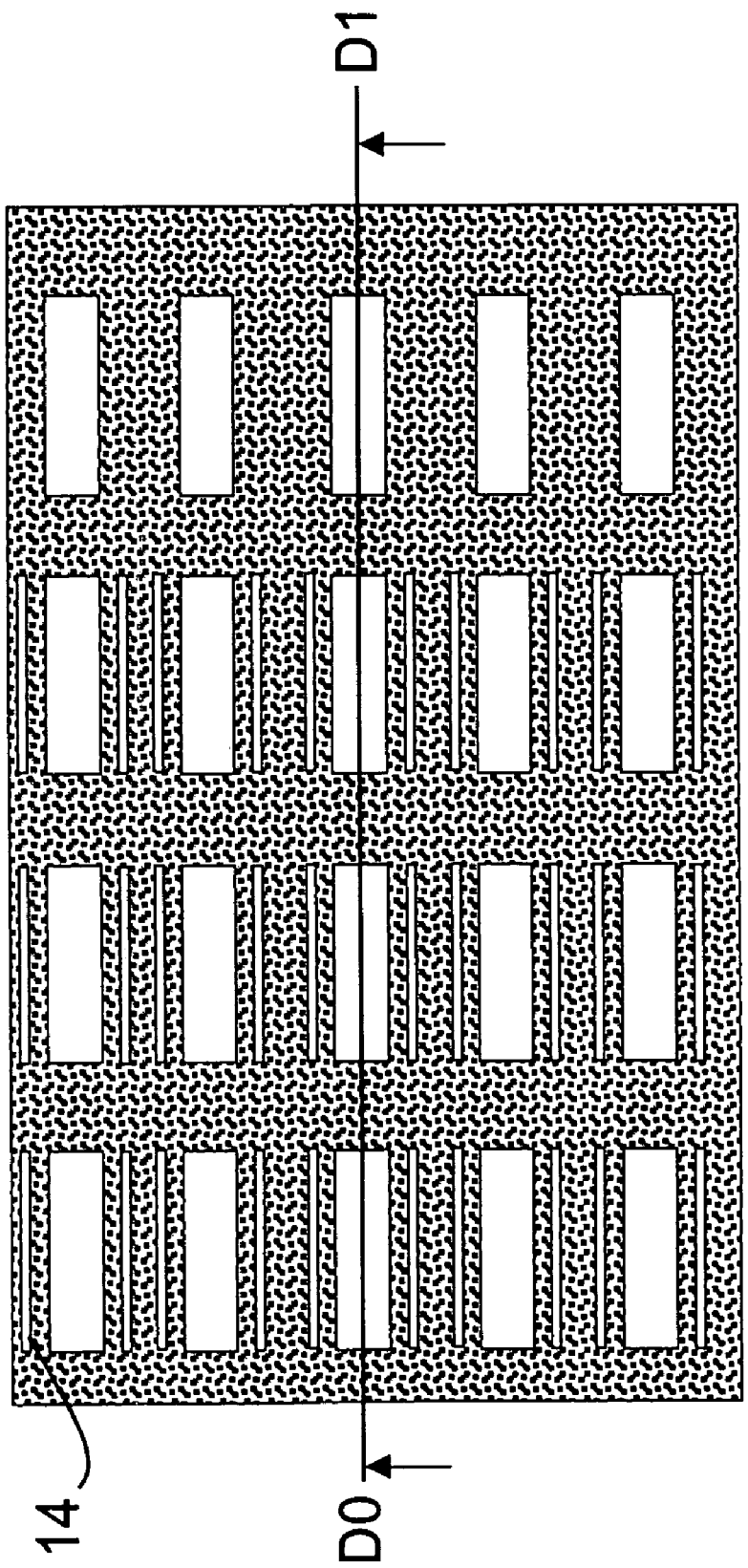
FIG. 10 is a view illustrating the method of correcting the mask pattern of the wiring according to the present invention.

FIG. 10 illustrates that an auxiliary pattern 14 (opening) is formed, to such an extent that the resist is not resolved, in a position vicinal to but spaced away from the wiring in the hole existing region. Further, the auxiliary pattern may take a polygonal shape, e.g., a rectangular shape. An example in FIG. 10 is that the auxiliary pattern is a narrow line substantially parallel to the wiring pattern and narrower in width than the wiring pattern. It is desirable that an auxiliary pattern size (line width) is equal to or smaller than 70 nm on the wafer. A contrivance of the mask in FIG. 10 is that the quantity of exposure with which the vicinity of the hole existing region is exposed to the light is increased owing to this auxiliary pattern 14.

Figure 11:
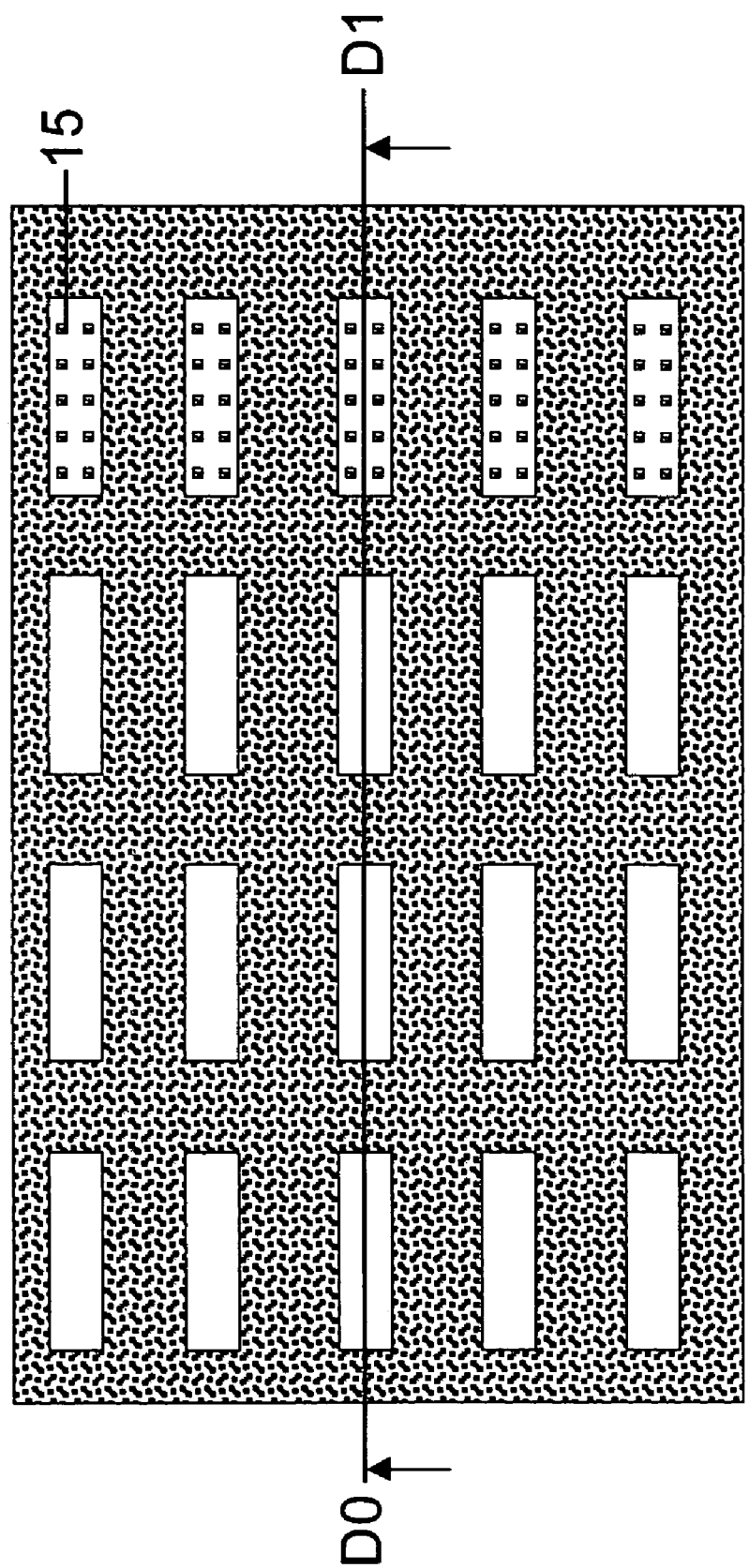
FIG. 11 is a view illustrating the method of correcting the mask pattern of the wiring according to the present invention.

FIG. 11 shows that an auxiliary pattern 15 is formed inwardly of the wiring in the hole non-existing region to such an extent that the resist is not resolved. It is desirable that the auxiliary pattern size is equal to or smaller than 70 nm on the semiconductor substrate. Further, the auxiliary pattern may take the polygonal shape, e.g., the rectangular shape. The quantity of exposure with which the vicinity of the hole non-existing region is exposed to the light is decreased owing to this auxiliary pattern 15.

Figure 12:
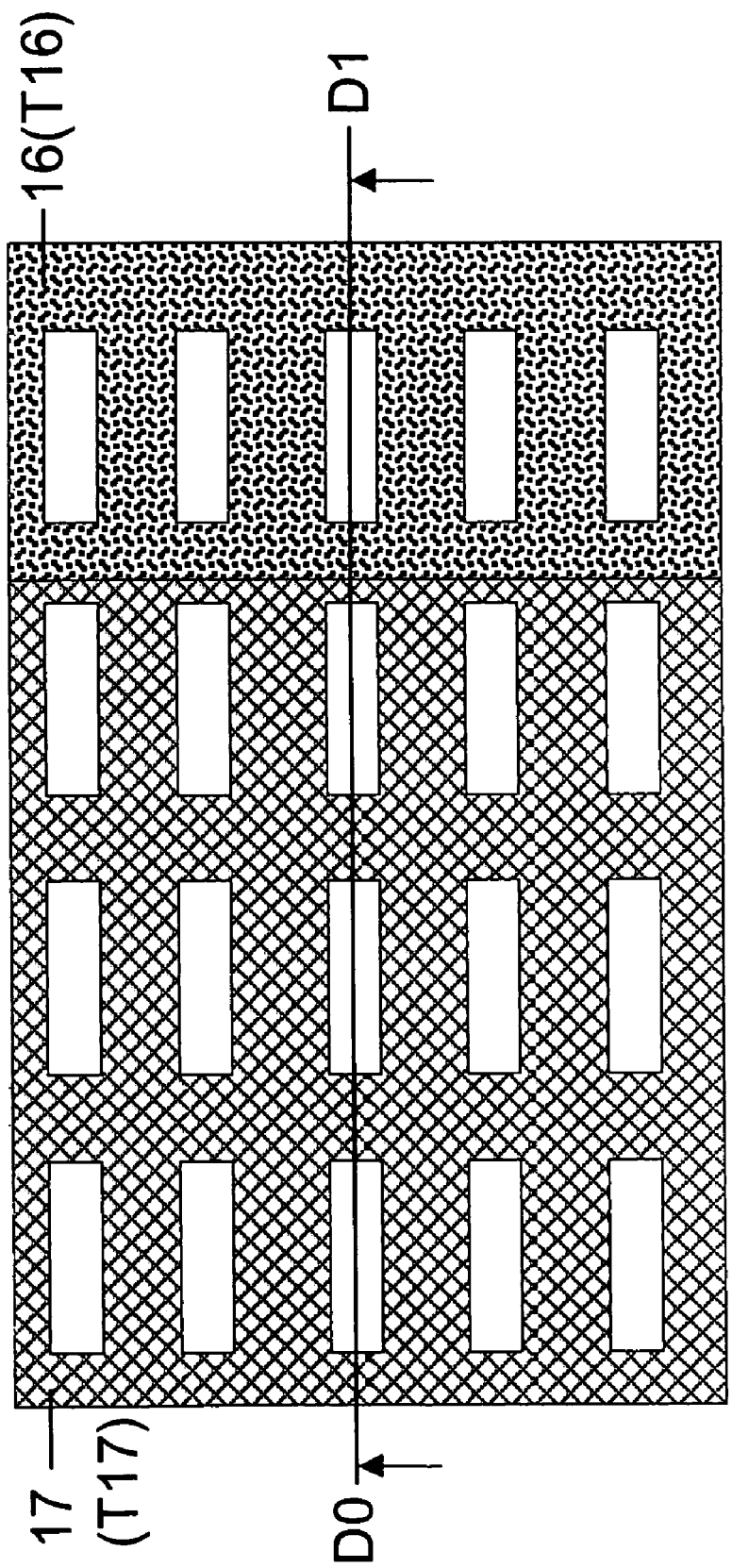
FIG. 12 is a view illustrating the method of correcting the mask pattern of the wiring according to the present invention.

Changed in FIG. 12 are a transmittance T16 of a light shielding area 16 in the vicinities of the wiring patterns in the hole non-existing regions and a transmittance T17 of a light shielding area 17 in the vicinities of the wiring patterns in the hole existing regions. Accordingly, the mask in FIG. 12 includes transmissive regions defined as the wiring patterns and the light shielding areas having the two types of transmittances, thereby forming a tri-tone mask.

The transmittance T16 is desirably 4% through 10%, and the transmittance T17 is desirably 6% through 12%. Any inconvenience may not, as a matter of course, be caused by setting the transmittance T16 to 0% and the transmittance T17 to 4% through 12%.

Figure 15:
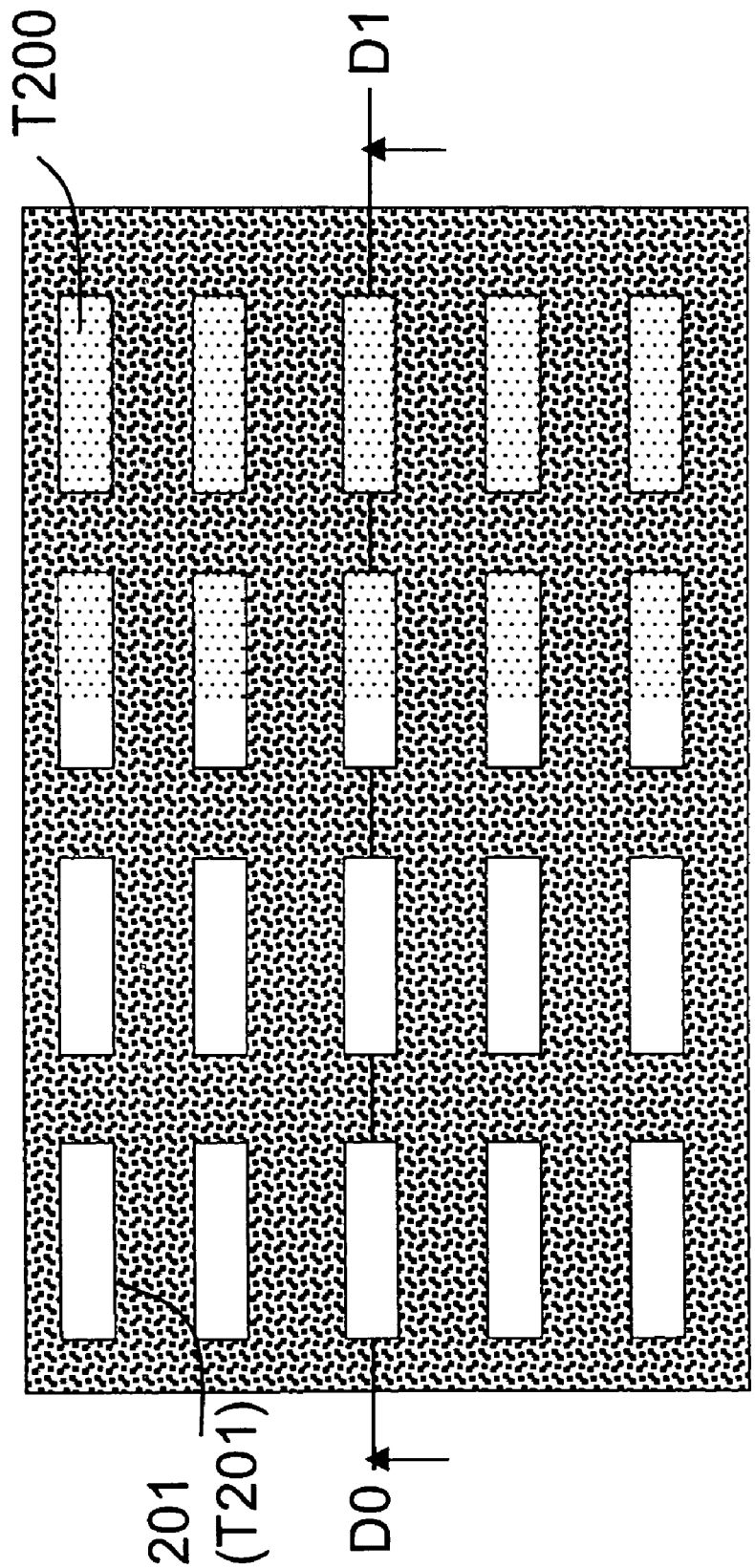
FIG. 15 is a view illustrating the method of correcting the mask pattern of the wiring according to the present invention.

In FIG. 15, a ultraviolet ray transmittance T201 of a just-above-the-hole region 201 is set higher than a ultraviolet ray transmittance T200 of one other region. For example, the ultraviolet ray transmittance T201 of the just-above-the-hole region 201 is desirably 100%, while the ultraviolet ray transmittance T200 of the other region is desirably 90% through 99%. Hence, the mask in FIG. 15 includes the wiring patterns (the transmissive regions) having the two types of transmittances and the light shielding region, thereby forming a tri-tone mask.

Figure 16:
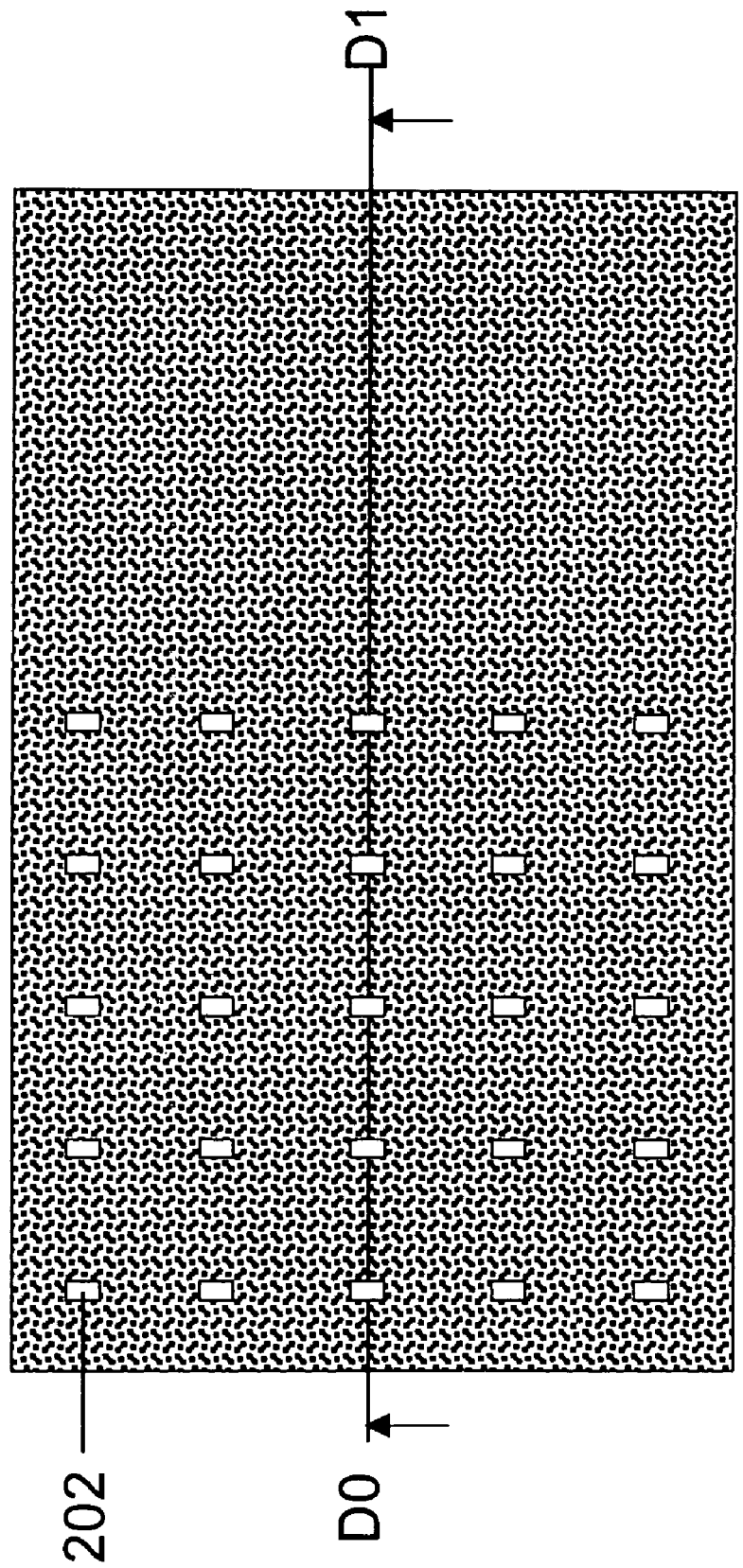
FIG. 16 is a view illustrating the method of correcting the mask pattern of the wiring according to the present invention.

FIG. 16 illustrates a mask on the occasion of performing dual exposures by use of a mask having a pattern 202 for increasing the quantity of exposure of the just-above-the-hole region. A dual exposure step involves employing a first mask having a transferred pattern for exposing the wiring pattern to the light and a second mask including an opening having such a dimension (size) as not to form a transferring pattern on the substrate when exposed to the light in the vicinity of a pattern for exposing a wiring groove of at least the just-above-the-hole region to the light. FIG. 16 shows an example of the second mask. The size of the pattern 202 is desirably equal to or smaller than 50% of a size of a desired hole. The pattern 202 takes a polygonal shape such as a rectangular shape.

Note that a half-tone mask exhibiting a light shielding characteristic less than 100% may also be used as the first mask or the second mask in place of the mask including the 100% light shielding enabled pattern (e.g., a chrome layer).

Figure 13:
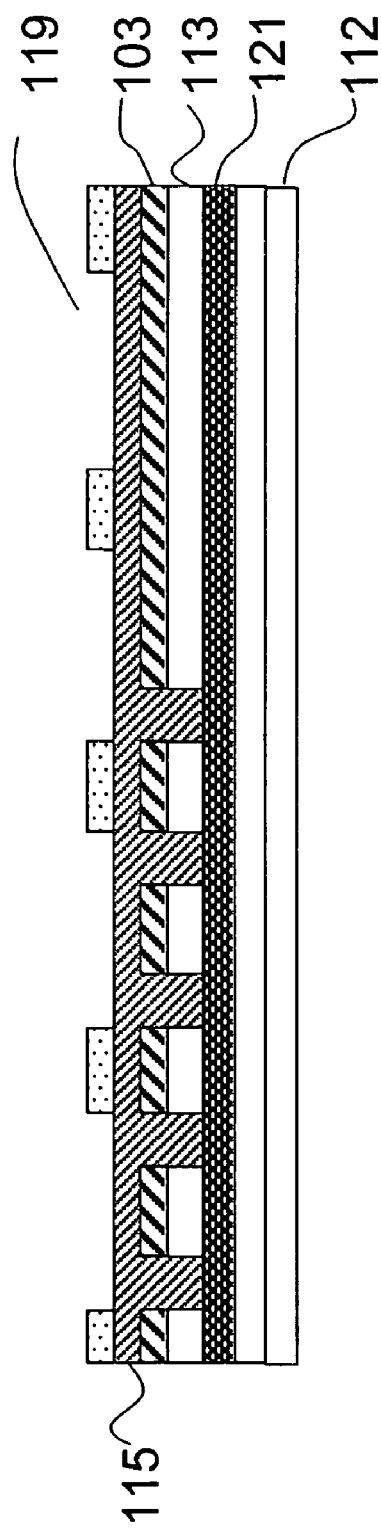
FIG. 13 is a view showing a wiring pattern obtained by use of the mask pattern according to the present invention.

A wiring pattern 119 having, as shown in FIG. 13, none of the opening defects, could be transferred and formed by employing the wiring masks illustrated in FIGS. 7-12. FIG. 13 is a sectional view as viewed in a direction corresponding to a direction of an arrowhead line in a way of cutting off the semiconductor substrate in a direction toward the lower layer from above the surface of the substrate in a position of projecting a line segment D0-D1 in FIGS. 7-12. FIG. 13 shows, on the semiconductor substrate 112, the etching stopper 121, the inter-layer film 113 (composed of, e.g., porous silica) having a low dielectric constant and holes penetrating the inter-layer film 113 down to the etching stopper 121, the mask thin film 103 defined as the hard mask layer for forming the holes, and the wiring patterns 119 of the resists that are formed on the anti-reflective coating 115.

Figure 14:
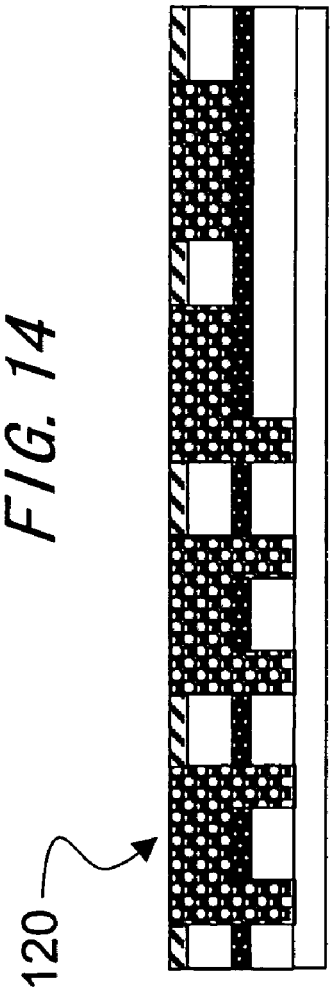
FIG. 14 is a view showing a dual Damascene structure obtained by use of the mask pattern according to the present invention.

Subsequently, the etching is conducted, and a metal (a hatching area 120) such as Cu is embedded, whereby the dual Damascene structure could be built up (FIG. 14). The structure in FIG. 14 is such that the holes in the dual Damascene structure 120 penetrate, as in FIGS. 3G-3J, the inter-layer film defined as the low dielectric constant film composed of the porous silica etc and, at least, the hard mask and the etching stopper layer.

The hard mask layer (the mask thin film 103) in the present embodiment discussed above may be formed of at least the SiO, SiC, SiOC, SiOCN or SiN film. Further, the inter-layer film 113 may also be composed of the inorganic siloxane or the organic siloxane.

As a matter of course, there may not be caused any inconvenience by using a combination of the two or more methods given above. Namely, possible combinations are those of two or more of the following patterns:

(1) the mask pattern in which to increase the size of the wiring pattern in the hole existing region shown in FIG. 7;
(2) the mask pattern in which to change only the size of the wiring pattern disposed in the outside area of the hole array shown in FIG. 8;
(3) the mask pattern in which the size changing region as shown in FIG. 9 is limited to the one side (the hole existing region) of the wiring;
(4) the mask pattern with the auxiliary pattern 14 formed to such an extent that the resist is not resolved as shown in FIG. 10;
(5) the mask pattern with the auxiliary pattern 15 formed inwardly of the wiring in the hole non-existing region to such an extent that the resist is not resolved shown in FIG. 11;
(6) the mask pattern with the change of the transmittance T16 of the light shielding area 16 in the vicinities of the wiring patterns in the hole non-existing regions and with the change of the transmittance T17 of the light shielding area 17 in the vicinities of the wiring patterns in the hole existing regions shown in FIG. 12; and
(7) the mask pattern for the dual exposures as illustrated in FIG. 16. Alternatively, the pattern may also be formed by applying the dual exposures. Thus, the quantity of exposure of the wiring pattern just above the hole or in the vicinity of the hole can be relatively increased as compared with the quantity of exposure of the wiring pattern in the position spaced away from the hole. It is therefore possible to restrain such a phenomenon that the protons ($H^+$) in the chemical amplification type resist are disappeared by the basic substance taken into the base when forming the holes, and to reduce a fluctuation in pattern size or the opening defect of the pattern.

In the steps described above, the half-tone mask exhibiting the light shielding characteristic less than 100 percent may also be employed as the mask in place of the mask having the 100% light shielding enabled pattern (e.g., the chrome layer) and the transmissive region.

<Working Example in the Case of Isolated Hole>

Figure 17:
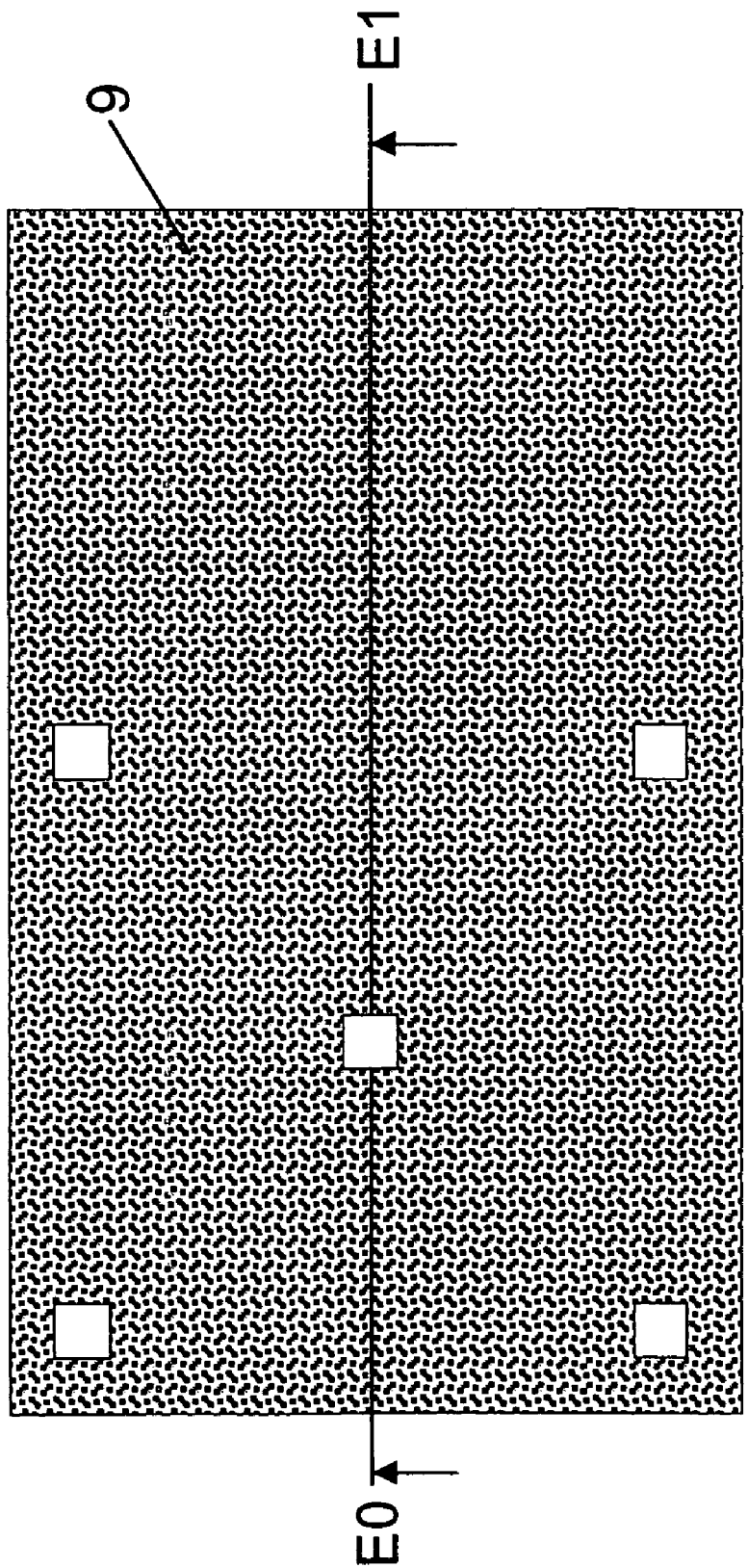
FIG. 17 is a view illustrating the mask pattern of the hole employed in the working example.
Figure 18:
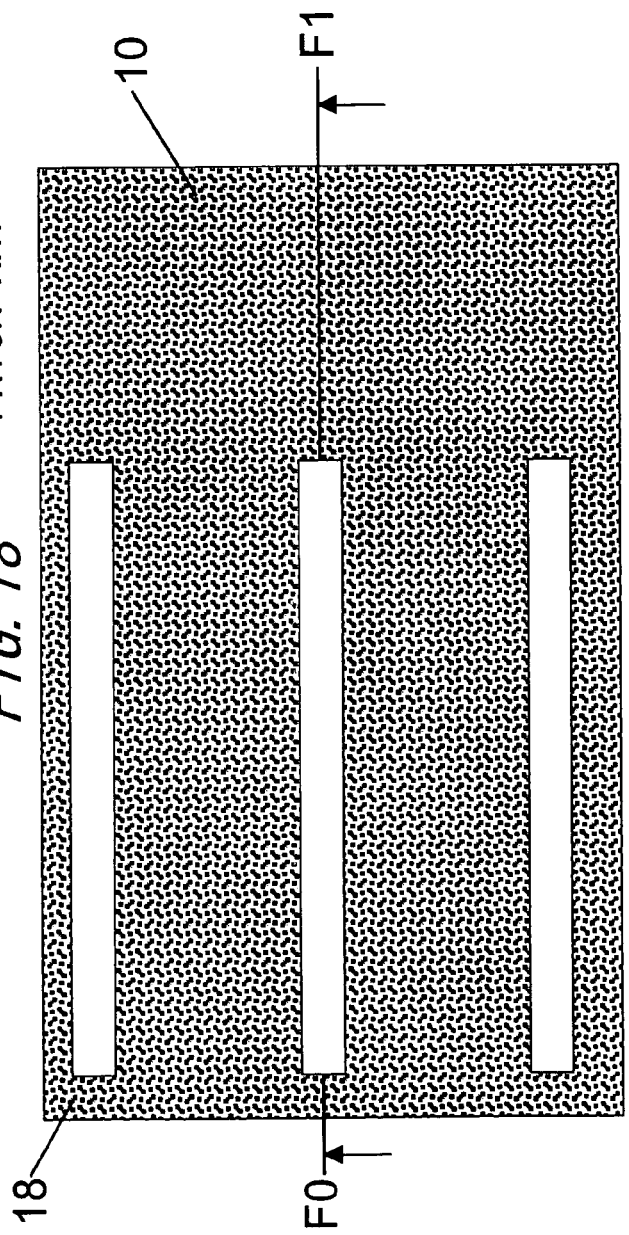
FIG. 18 is a view depicting the mask pattern of the wiring that is employed in the working example.

FIGS. 17-27 illustrate a working example to which the present invention is applied in the case where the isolated hole exists. FIG. 17 shows a mask 9 through which the hole layer is exposed to the light. The mask 9 is covered with the light shielding layer (which is a hatching area and is, e.g., chrome) excluding the hole patterns. FIG. 18 illustrates a mask 10 through which to expose, to the light, a wiring layer that should be formed as an upper layer on the hole layer formed by use of the mask 9 in FIG. 17. The mask 10 is covered with the light shielding layer (which is a hatching area and is, e.g., chrome) excluding the wiring patterns.

Figure 19:
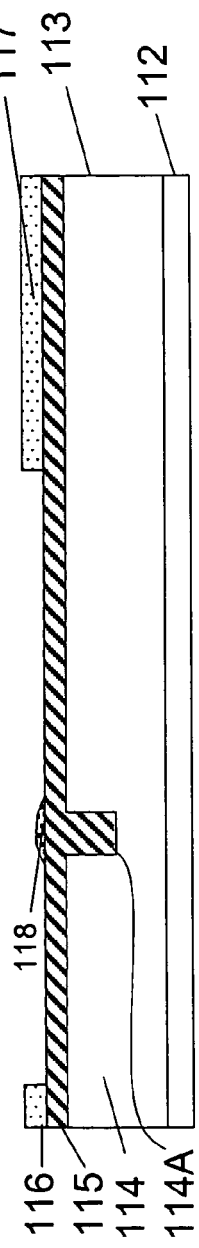
FIG. 19 is a view showing the dual Damascene structure obtained by employing the mask patterns in FIGS. 17 and 18.

FIG. 19 shows an example of the resist poisoning in the case of the isolated pattern. FIG. 19 is a sectional view of the semiconductor substrate formed with the patterns by employing the mask 9 and the mask 10. This sectional view shows a section of the semiconductor substrate cut off in a position where a line segment E0-E1 in FIG. 17 and a line segment F0-F1 in FIG. 18 are projected on the semiconductor substrate. As in the case of FIGS. 4 and 5, the line segment E0-E1 and the line segment F0-F1 are in the overlapped relationship with each other.

FIG. 19 illustrates a state where after a hole 114A has been formed in an inter-layer film 114 by performing the exposure through the mask 9 and by developing and etching, the anti-reflective coating 115 and the chemical amplification type positive resist 116 are coated over there, then the exposure is conducted through the mask 10, and the development is carried out. If an isolated hole pattern is formed on the semiconductor substrate through the mask as shown in FIG. 17, when developing the chemical amplification type positive resist 116 as an upper layer thereof, there might be a case in which a region 118 of the resist 116 in the resist, which should be originally dissolved, remains just above the hole 114A.

Figure 20:
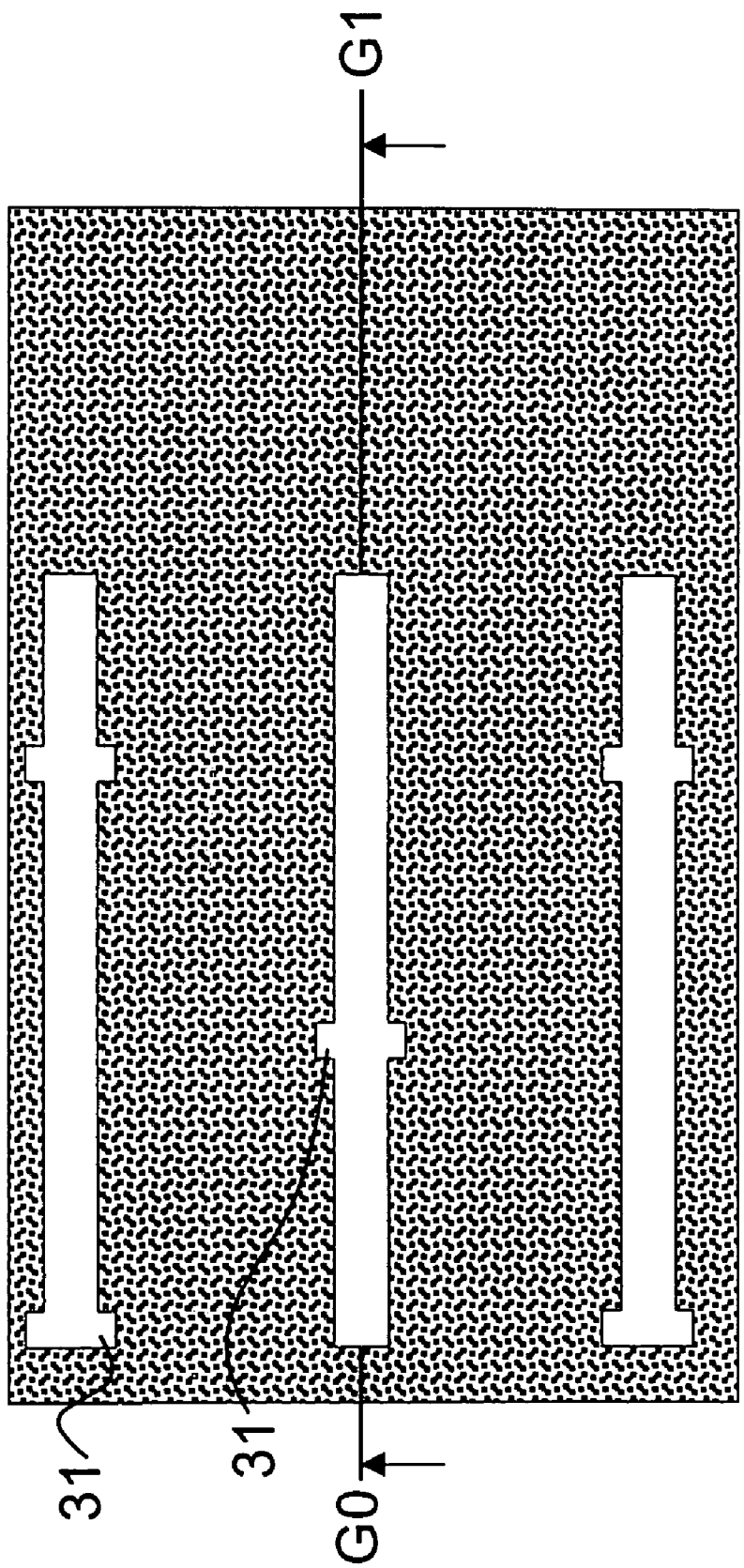
FIG. 20 is a view showing a method of correcting the mask pattern of the wiring according to the present invention.

FIG. 20 shows an example of an improved mask used in the present working example. The improved mask in FIG. 20 is that the quantity of exposure is corrected by increasing the size of the wiring pattern of the region (in the vicinity just above the hole) where the isolated hole exists (see a wiring protruded pattern denoted by the reference numeral 31). To be specific, the improved mask in FIG. 20 is such that a protruded shape is formed by adding a rectangular pattern to the wiring pattern just above the isolated hole in a region to be exposed to the light. Then the wiring pattern just above the isolated hole has a larger line width than other wiring pattern. This configuration brings about an increase in the quantity of exposure when exposing, to the light, the wiring pattern just above the isolated hole.

This type of correction may be applied to the pattern before changing the pattern size by the OPC. Further, the correction in FIG. 20 may also be applied to the pattern after changing the pattern size by the OPC.

Figure 21:
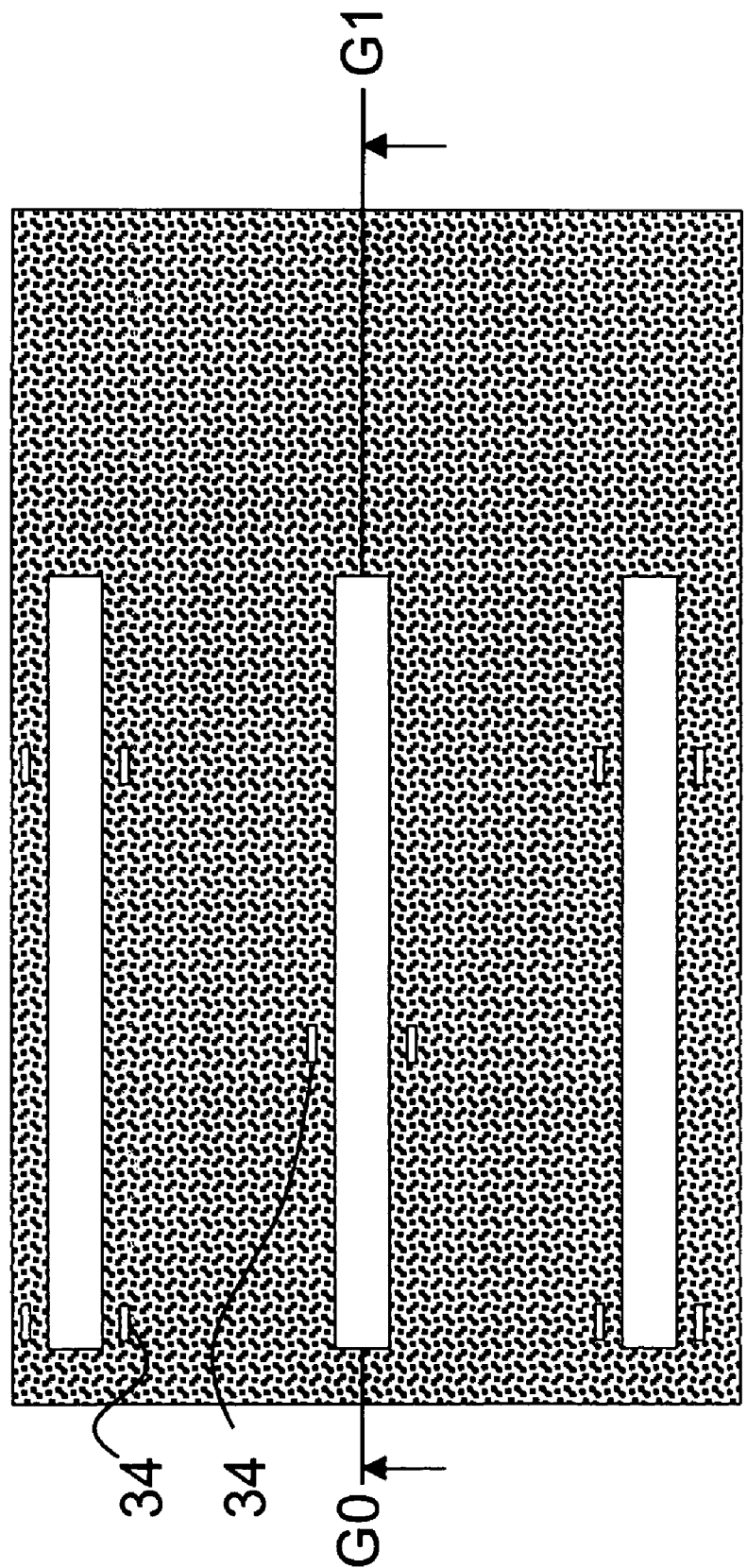
FIG. 21 is a view showing a method of correcting the mask pattern of the wiring according to the present invention.

In FIG. 21, an auxiliary pattern 34 is formed, to such an extent that the resist is not resolved, in the vicinity of the wiring in the region where the isolated hole exists, thereby correcting the quantity of exposure.

Figure 22:
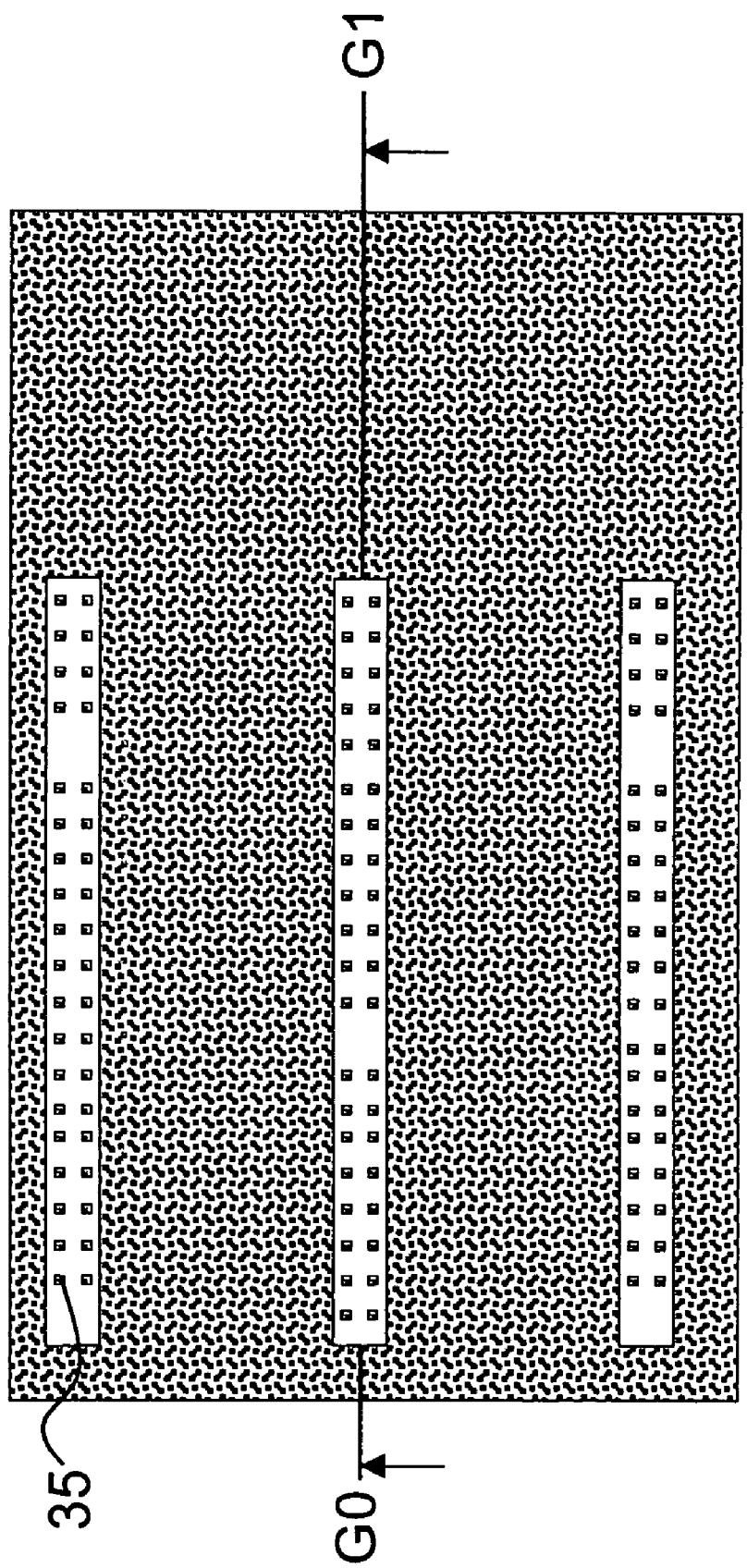
FIG. 22 is a view showing a method of correcting the mask pattern of the wiring according to the present invention.

In FIG. 22, an auxiliary pattern 35 is formed, to such an extent that the resist is not resolved, inwardly of the wiring in the region other than just above the isolated hole where the isolated hole does not exist, thereby reducing the quantity of exposure. While on the other hand, the auxiliary pattern 35 is not formed inwardly of the wiring in the region where the isolated hole exists. With this configuration, the quantity of exposure is adjusted by relatively increasing the quantity of exposure of the hole existing region to a greater degree than the quantity of exposure of the hole non-existing region in the wiring pattern.

Figure 23:
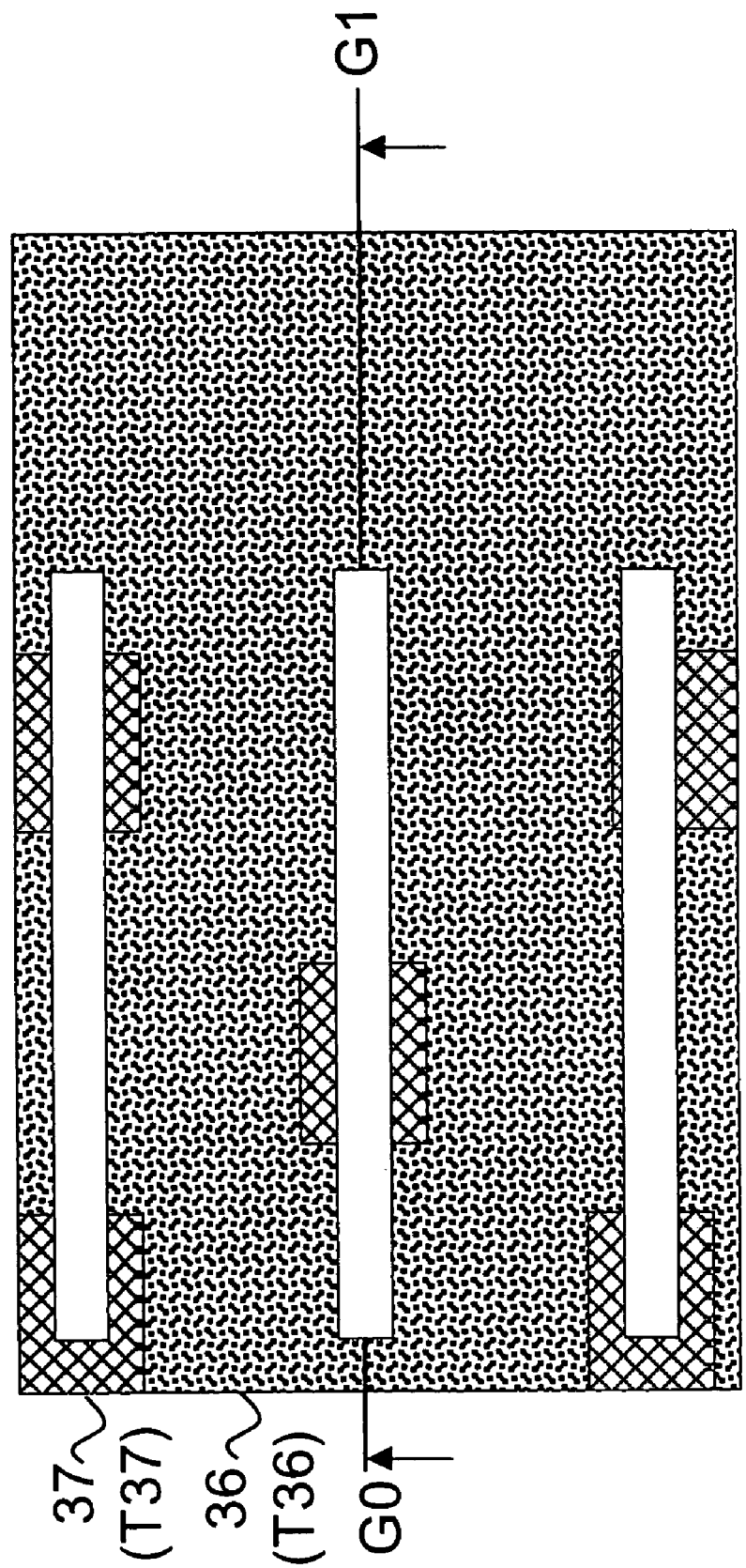
FIG. 23 is a view showing a method of correcting the mask pattern of the wiring according to the present invention.

Changed in FIG. 23 are a transmittance T36 of a light shielding area 36 in the vicinity of the wiring pattern in the region where the isolated hole does not exist and a transmittance T37 of a light shielding area 37 in the vicinity of the wiring pattern in the region where the isolated hole exists. The transmittance T37 of the region where the isolated hole exists is set higher than the transmittance T36 of the region where the isolated hole does not exist, thereby adjusting the quantity of exposure. Accordingly, the mask in FIG. 23 includes the transmissive region defined as the wiring pattern and the light shielding areas having the two types of transmittances, thereby forming the tri-tone mask.

Figure 24:
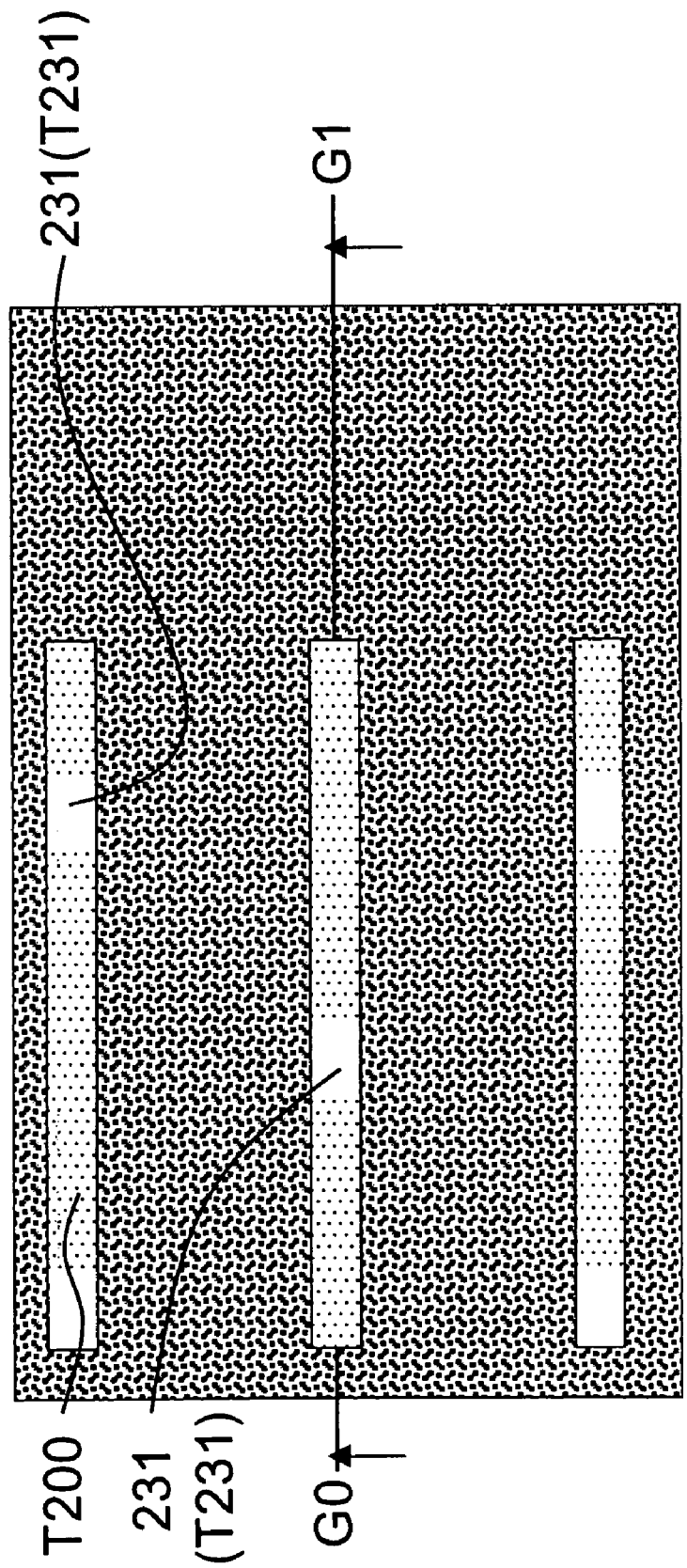
FIG. 24 is a view showing a method of correcting the mask pattern of the wiring according to the present invention.

In FIG. 24, a ultraviolet ray transmittance T231 of a just-above-the-isolated-hole region 231 is set higher than a ultraviolet ray transmittance T200 of one other region. Hence, the mask in FIG. 24 includes the wiring patterns (the transmissive regions) having the two types of transmittances and the light shielding region, thereby forming a tri-tone mask.

Figure 25:
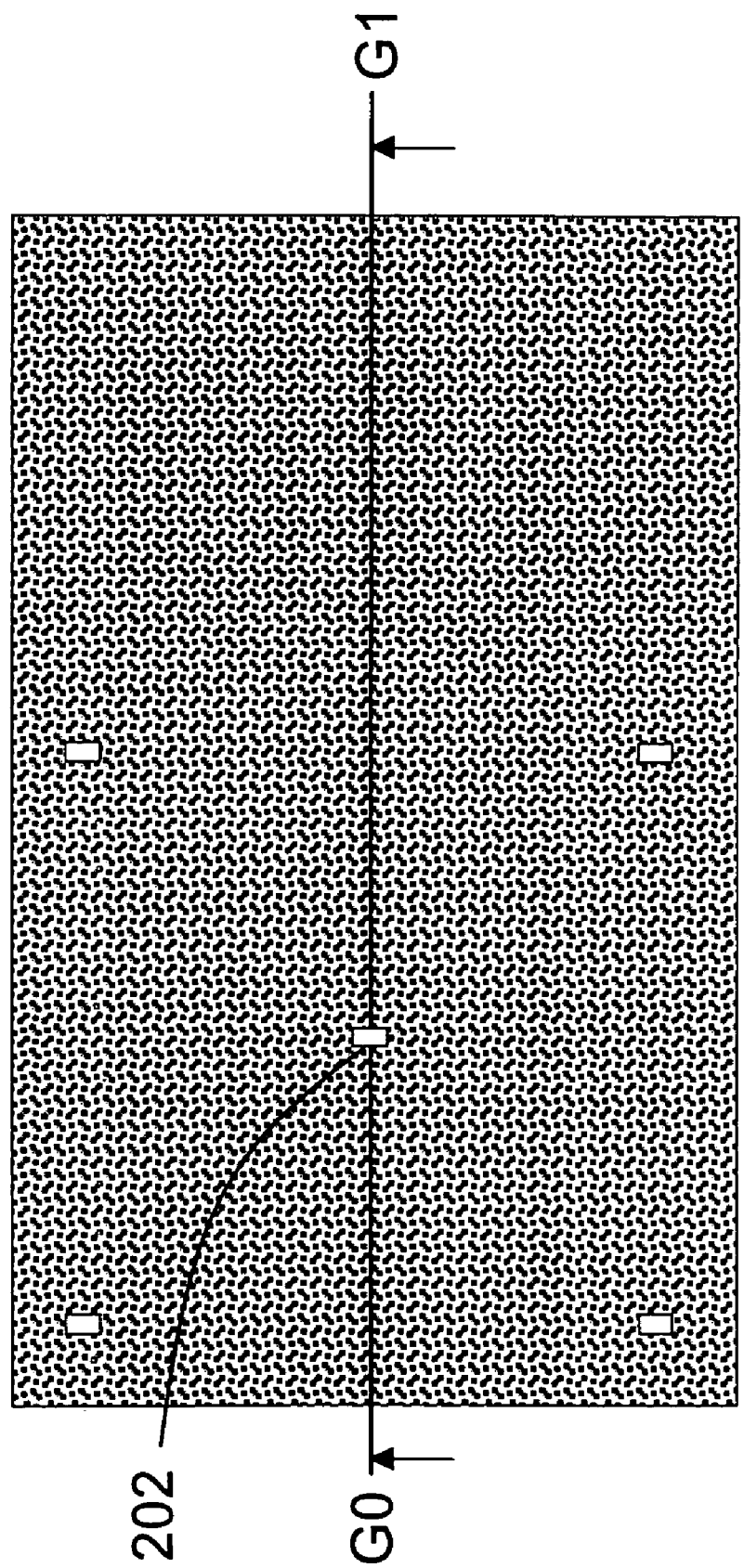
FIG. 25 is a view showing a method of correcting the mask pattern of the wiring according to the present invention.

FIG. 25 illustrates a mask on the occasion of conducting the dual exposures by use of the mask including patterns 202 for increasing the quantities of exposure of the regions just above the isolated holes. The pattern 202 takes a polygonal shape, e.g., a rectangular shape.

It should be noted that the etching mask and the etching stopper are not necessarily required in the present working example, and any inconvenience may not be caused by applying the present working example to the dual Damascene structure that omits the etching mask and the etching stopper by optimizing process conditions.

Figure 26:
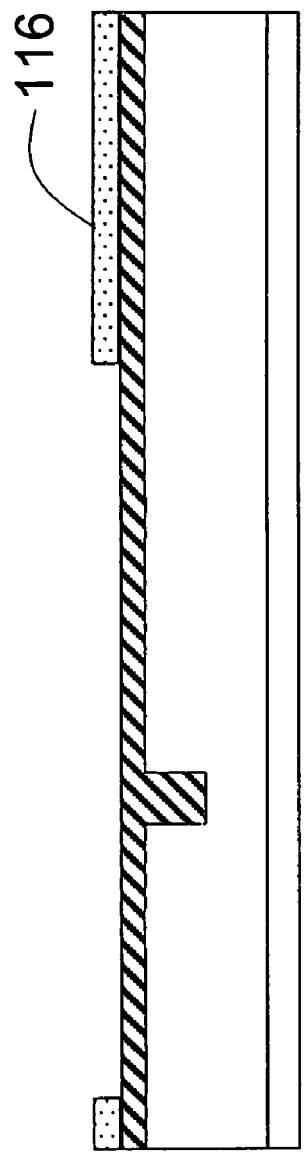
FIG. 26 is a view showing a pattern shape of the resist that is acquired by use of the mask pattern according to the present invention.

FIG. 26 illustrates a pattern shape of the chemical amplification type positive resist 116 obtained by the masks in FIGS. 20 through 25. By employing the wiring masks shown in FIGS. 20-25, as depicted in FIG. 26, the wiring pattern without any opening defect could be transferred. FIG. 26 is a sectional view as viewed in a direction corresponding to a direction of an arrowhead line in FIGS. 20-25 in a way of cutting off the semiconductor substrate in a direction toward the lower layer from above the surface of the substrate in a position of projecting a line segment D0-D1 in FIGS. 20-25.

Figure 27:
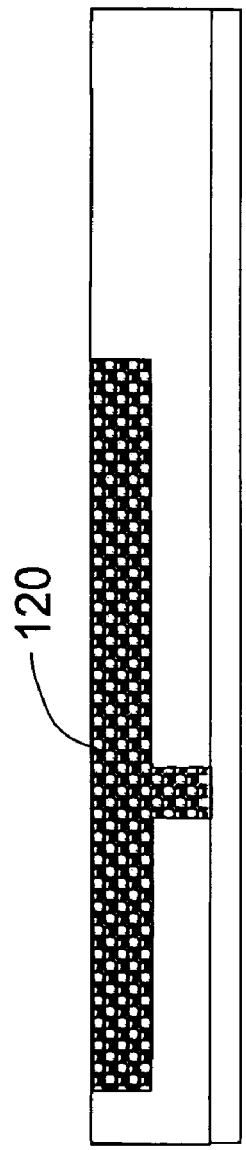
FIG. 27 is a view depicting the dual Damascene structure obtained by use of the mask pattern according to the present invention.

Subsequently, the etching is conducted, and the metal (the hatching area 120) such as Cu is embedded, whereby the dual Damascene structure could be built up (FIG. 27). The holes in the dual Damascene structure 120 according to the present embodiment penetrate, as in FIG. 13, the inter-layer film defined as the low dielectric constant film composed of the porous silica etc and, at least, the hard mask and the etching stopper (the hard mask and the etching stopper are omitted in FIG. 27).

Note that the hard mask layer may be, as in the case of FIGS. 13 and 14, formed of at least the SiO, SiC, SiOC, SiOCN or SiN film. Further, the inter-layer film may also be composed of the inorganic siloxane or the organic siloxane.

As a matter of course, there may not be caused any inconvenience by using a combination of the two or more methods given above.

<Control of Proton Generation Quantity by Heating>

The procedure described above is that the pattern size (line width) of the wiring on the mask is changed so as to increase the quantity of exposure of the wiring region just above the hole or in the vicinity of the hole. Moreover, the pattern size (line width) of the wiring on the mask is changed so as to increase the quantity of exposure of the wiring region as the upper layer in the outside area of the hole array. Still further, the quantity of exposure is controlled by providing the auxiliary pattern in the vicinity of the wiring pattern. Alternatively, the light transmission quantity of the wiring region of the mask or the light shielding region of the mask is changed.

As a substitute for these procedures, or together with this type of exposure quantity control, after the exposure through the wiring mask 10, only an area (encompassed by a dotted line 18 in FIG. 5) where the hole layers 114 exist may be heated by use of, e.g., a laser etc. This is because the chemical amplification type resist has the same effect owing to the heating as in the case of increasing the quantity of exposure.

Figure 28:
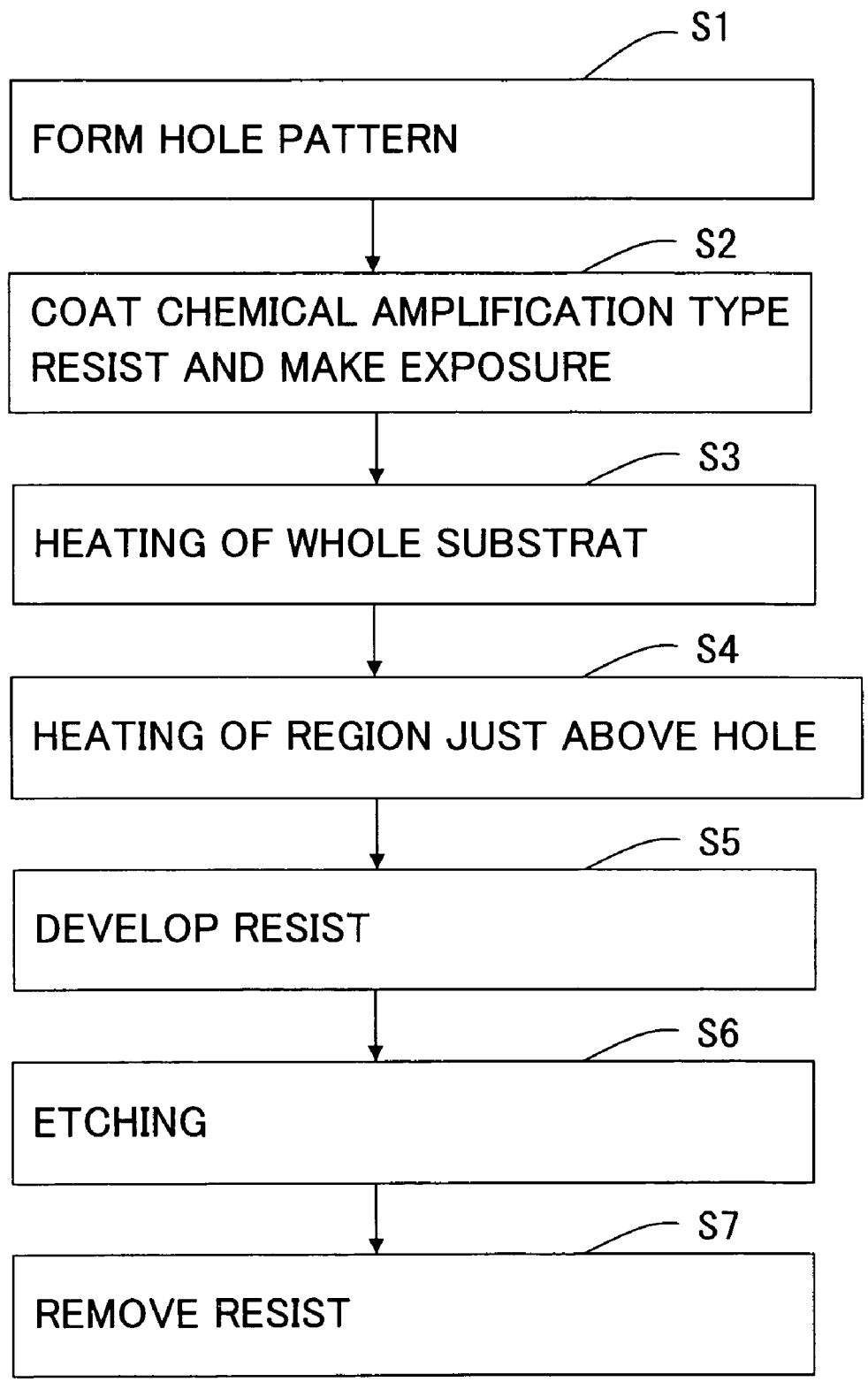
FIG. 28 is a flowchart showing a semiconductor device manufacturing process of controlling generation of protons by heating.

FIG. 28 shows a semiconductor device manufacturing process that controls the generation of the protons by the heating. This process controls the quantity of generation of the protons ($H^+$) on the occasion of forming the wiring pattern as the upper layer of the hole layer. Accordingly, a premise in this step (process) is that the hole pattern is, at first, formed on the semiconductor substrate (S1).

Next, the chemical amplification type resist is coated over the semiconductor substrate, and the wiring layer is exposed to the light through the mask 10 (see FIG. 5) (S2).

Subsequently, the semiconductor substrate is heated (S3). The heating of the semiconductor substrate serves to supplement a deficiency of the quantity of exposure in the chemical amplification type resist. This heating is conducted in a way that places the semiconductor substrate on, e.g., a hot plate and thus heats the semiconductor substrate. The heating is carried out within a range of, e.g., 100° C. (Celsius) through 200° C. to heat the whole semiconductor substrate.

Next, the just-above-the-hole region and the vicinity thereof are heated by radiation rays (radiations). The heating is based on the light of which a wavelength is longer than, e.g., 250 nm. It may be sufficient for this type of heating to use the mask through which to project the radiation rays upon the just-above-the-hole region and the vicinity thereof.

Next, the resist is developed (S5). Then, the etching is conducted with the resist being used as the mask, and the wiring layer pattern is formed on the semiconductor substrate (S6). Further, the resist is removed (S7). Moreover, the metal (Cu etc) is embedded in the hole and in the wiring layer, thereby forming the dual Damascene structure. In this case, the holes in the dual Damascene structure penetrate, as in FIG. 13, the inter-layer film defined as the low dielectric constant film composed of the porous silica etc and, at least, the hard mask and the etching stopper.

Further, the hard mask layer may be, as in the case of FIGS. 13 and 14, formed of at least the SiO, SiC, SiOC, SiOCN or SiN film. Moreover, the inter-layer film may also be composed of the inorganic siloxane or the organic siloxane.

Note that the steps described above may be combined with the steps shown in FIGS. 7-27.

<Dissolution of Solution Restrainer by Radiation Rays>

In the semiconductor device manufacturing process in FIG. 28, after the exposure, only the area (which is designated by 18 in FIG. 5) where the hole layer 114 exists is heated by employing, for instance, the laser etc. As a substitute for this procedure, or, together with the local heating, after forming the hole pattern, a substance (which will hereinafter be referred to as a solution hindering substance (e.g., the basic substance such as amine)) for inhibiting the generation of the protons ($H^+$) in the chemical amplification type resist may be dissolved by irradiation of the radiation rays. Namely, it may be sufficient that the solution inhibiting substance of the chemical amplification type resist is previously removed before resist coating.

Figure 29:
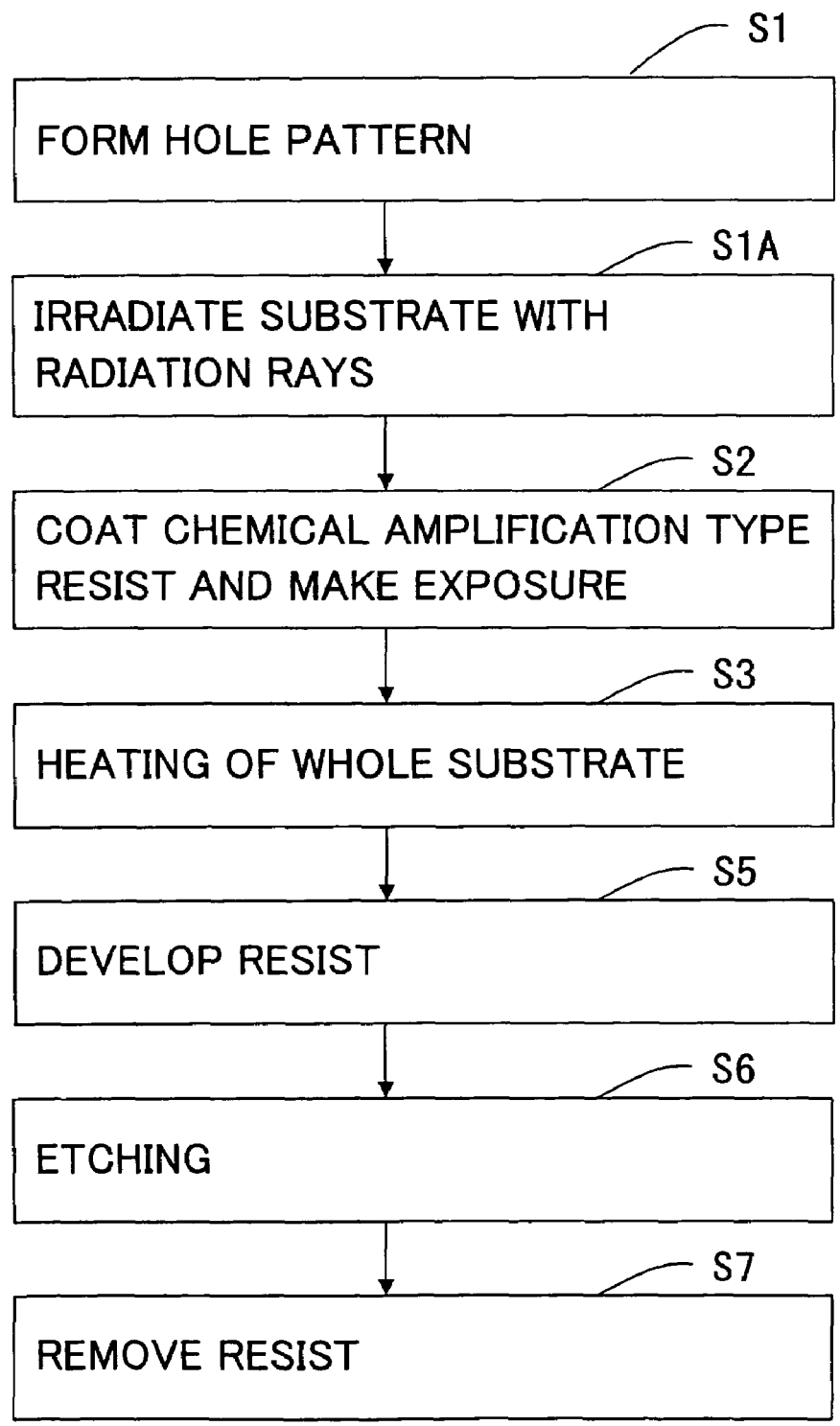
FIG. 29 is a flowchart showing a semiconductor device manufacturing process including a step of dissolving solution inhibiting substance by radiation rays.

FIG. 29 shows a semiconductor device manufacturing process including a step of dissolving the solution inhibiting substance by the radiation rays. In this manufacturing process, after forming the hole pattern on the semiconductor substrate (S1), the substrate is irradiated with the radiation rays (S1A). It is desirable that the radiation rays be ultraviolet rays of which a wavelength is shorter than 250 nm. It is because of dissolving the amine-series basic substance. This sort of ultraviolet rays can be emitted from plasmas containing hydrogen.

The steps subsequent to this are the same as those of the normal semiconductor process. Carried out are, to be specific, the coating and the exposure of the chemical amplification type resist (S2), the heating of the whole substrate (S3), the development of the resist (S5), the etching (S6) and the removal of the resist (S7) Further, the dual Damascene structure is built up by embedding the metal (Cu etc) in the hole and in the wiring layer. In this case, the holes in the dual Damascene structure penetrate, as by the step shown in FIG. 13 or FIG. 28, the inter-layer film defined as the low dielectric constant film composed of the porous silica etc and, at least, the hard mask and the etching stopper.

Moreover, the hard mask layer may be, as in the case of FIGS. 13 and 14, formed of at least the SiO, SiC, SiOC, SiOCN or SiN film. Further, the inter-layer film may also be composed of the inorganic siloxane or the organic siloxane.

Furthermore, these steps may also be conducted in the way of being combined with the exposure quantity control or the heating control as in FIGS. 7-28.

<Effect of the Embodiment>

As described above, in the steps according to the embodiment of the present invention, the quantity of exposure of the wiring pattern just above the hole or in the vicinity of the hole can be relatively increased as compared with the quantity of exposure of the wiring pattern in the position spaced away from the hole. Further, the wiring pattern just above the hole or in the vicinity of the hole can be heated to the greater degree than the wiring pattern in the position spaced away from the hole. Still further, the basic substance taken in the base when forming the hole can be dissolved. As a result, in the present steps, it is possible to prevent the resist poisoning and to form the dual Damascene structure without any opening defect at high accuracy.

A countermeasure against the resist poisoning is made in the area peripheral to the dense hole array as well as in the isolated holes. In the procedure according to the present embodiment, the auxiliary pattern under the resolution limit is utilized, and hence, actually, the dummy hole is not formed.

Moreover, the steps in the present embodiment and the masks used in these steps involve applying a conventional design method of the OPC, then the correction pattern for the countermeasure against the poisoning may be added, and therefore a load on a new design is small. In the case of applying the dual exposures, it is required that one piece of extra mask be prepared, however, a simple pattern can meet this requirement.

<Others>

The disclosures of Japanese patent application No. JP2006-164137 filed on Jun. 14, 2006 including the specification, drawings and abstract are incorporated herein by reference.

What is claimed is:

1. An exposure method applied to a substrate of a semiconductor device including a hole, comprising:
preparing a mask to cause a quantity of exposure with which a wiring groove just above the hole or a wiring groove in a vicinity and over the hole is exposed to light to be greater than a quantity of exposure with which a wiring groove in a position spaced away from just above the hole is exposed to the light;
exposing a pattern on the mask to light to transfer the pattern onto an upper layer of the hole and to form the wiring groove.

2. An exposure method, executed after processing a hole in a substrate of a semiconductor device, comprising:
exposing a pattern on a mask to light to transfer the pattern onto an upper layer of the hole and to form a wiring groove;
wherein a quantity of exposure with which the wiring groove just above the hole or the wiring groove in a vicinity and over the hole is exposed to the light is greater than a quantity of exposure with which the wiring groove in a position spaced away from just above the hole is exposed to the light, and
wherein the exposing the pattern employs a mask having an addition of an auxiliary pattern for adjusting the quantity of exposure to the pattern for exposing the wiring groove to the light.

3. The exposure method according to claim 2, wherein the auxiliary pattern added to the wiring groove of an upper layer in a high-density hole area of which a hole density is higher than a predetermined value, is an opening having such a dimension that a transferred pattern is not formed on the substrate when exposed to the light, the opening being separated from the pattern for exposing the wiring grove to the light.

4. The exposure method according to claim 2, wherein the auxiliary pattern added to the wiring groove of an upper layer in a high-density hole area of which a hole density is higher than a predetermined value, is a protrusion having such a dimension that a transferred pattern is not formed on the substrate when exposed to the light, the protrusion being protruded from the pattern for exposing the wiring grove to the light.

5. The exposure method according to claim 2, wherein the auxiliary pattern added to the wiring groove just above the hole in a low-density hole area of which a hole density is lower than a predetermined value, is an opening having such a dimension that a transferred pattern is not formed on the substrate when exposed to the light, the opening being separated from the pattern for exposing the wiring grove to the light, or is a protrusion having such a dimension that a transferred pattern is not formed on the substrate when exposed to the light, the protrusion being protruded from the pattern for exposing the wiring grove to the light.

6. The exposure method according to claim 2, wherein the auxiliary pattern is a pattern having a polygonal shape, which is provided inwardly of the pattern for exposing the wiring groove to the light and has such a dimension that a transferred pattern is not formed on the substrate when exposed to the light.

7. The exposure method according to claim 1, wherein the mask is a half-tone mask.

8. The exposure method according to claim 1, wherein the mask causes a light transmittance of a transferred pattern area for exposing the wiring groove just above the hole to the light or exposing the wiring groove in the vicinity and over the hole to the light to be higher than a light transmittance of a transferred pattern area for exposing the wiring groove in the position spaced away from just above the hole, to the light.

9. The exposure method according to claim 1, wherein the mask is a tri-tone mask.

10. The exposure method according to claim 1, wherein the exposing the pattern includes a dual exposure of exposing one exposure portion to the light twice.

11. An exposure method, executed after processing a hole in a substrate of a semiconductor device, comprising:
exposing a pattern on a mask to light to transfer the pattern onto an upper layer of the hole and to form a wiring groove;
wherein a quantity of exposure with which the wiring groove just above the hole or the wiring groove in a vicinity and over the hole is exposed to the light is greater than a quantity of exposure with which the wiring groove in a position spaced away from just above the hole is exposed to the light and the exposing the pattern includes a dual exposure of exposing one exposure portion to the light twice, and wherein the dual exposure employs a first mask having a pattern for exposing the wiring groove to the light and a second mask including an opening having such a dimension that a transferred pattern is not formed on the substrate when exposed to the light in a vicinity of the pattern for exposing the wiring groove of at least an area just above the hole to the light.

12. The exposure method according to claim 11, wherein any one of the exposure first mask and the second mask is a half-tone mask.

13. An exposure method, executed after processing a hole in a substance of a semiconductor device, comprising:

exposing a pattern on a mask to light to transfer the pattern onto an upper layer of the hole and to form a wiring groove;

wherein a quantity of exposure with which the wiring groove just above the hole or the wiring groove in a vicinity and over the hole is exposed to the light is greater than a quantity of exposure with which the wiring groove in a position spaced away from just above the hole is exposed to the light, and wherein a quantity of exposure of the wiring groove just above the hole or in the vicinity and over the hole is set corresponding to a hole density of an lower layer of the wiring groove or a vicinal area, and a quantity of exposure in an area of which the hole density is higher than a first density, is greater than a quantity of exposure in an area of which the hole density is lower than the first density.

14. The exposure method according to claim 1, wherein a wavelength of a light source for the exposing the pattern is shorter than approximately 250 nm.

15. The exposure method according to claim 1, wherein the hole penetrates an insulating film of which a dielectric constant decreases due to existence of voids, and at least a hard mask layer and an etching stopper layer.

16. The exposure method according to claim 15, wherein the insulting film is an inorganic siloxane or an organic siloxane.

17. The exposure method according to claim 15, wherein the hard mask layer is formed of at least a SiO, SiC, SiOC, SiOCN or SiN film.

18. A method of forming a resist pattern, comprising:

exposing, after a hole has been processed in a substrate of a semiconductor device, a pattern of a wiring groove to light upon a chemical amplification type resist;

heating the substrate at a temperature of 100°C. through 200°C.; and further heating a resist area upon which the pattern of the wiring groove is exposed to the light just above the hole or in a vicinity and over the hole.

19. The method of forming a resist pattern according to claim 18, wherein the further heating the resist is done by rays of which a wavelength is longer than approximately 250 nm.

20. A method of manufacturing a semiconductor device including a hole, comprising;

dissolving a solution hindering substance against a chemical amplification type resist after the hole has been processed in a substrate of the semiconductor device with etching gas, by irradiating the substrate with radiation rays; and coating the chemical amplification type resist after the irradiating of the substrate with the radiation rays.

21. The method of manufacturing a semiconductor device according to claim 20, wherein the radiation rays are ultraviolet rays of which a wavelength is shorter than approximately 250 nm.

22. The method of manufacturing a semiconductor device according to claim 20, wherein the radiation rays are radiated from plasmas of a gas containing hydrogen.

23. A method of manufacturing a semiconductor device including a hole, comprising;

dissolving a solution hindering substance against a chemical amplification type resist after the hole has been processed in a substrate of a semiconductor device with etching gas, by heating the substrate at 100°C. through 200°C. and irradiating the substrate with radiation rays; and coating the chemical amplification type resist after the heating and the irradiating of the substrate with the radiation rays.

24. The method of manufacturing a semiconductor device according to claim 20, wherein the hole penetrates an insulating film of which a dielectric constant decreases due to existence of voids, and at least a hard mask layer and an etching stopper layer.

25. The method of manufacturing a semiconductor device according to claim 24, wherein the insulting film is an inorganic siloxane or an organic siloxane.

26. The method of manufacturing a semiconductor device according to claim 24, wherein the hard mask layer is formed of at least a SiO, SiC, SiOC, SiOCN or SiN film.

* * * * *